United States Patent [19]
Horibe et al.

[11] Patent Number: 5,666,341
[45] Date of Patent: Sep. 9, 1997

[54] DATA DETECTION APPARATUS

[75] Inventors: Ryusuke Horibe; Toshiyuki Shimada, both of Kobe; Hiromiti Ishibashi, Ibaraki; Hiroyuki Miyachi, Nagaokakyo, all of Japan

[73] Assignee: Matsushita Electric Industrial Co., Ltd., Kadoma, Japan

[21] Appl. No.: 710,266

[22] Filed: Sep. 13, 1996

[30] Foreign Application Priority Data

Sep. 18, 1995 [JP] Japan ................................ 7-238115

[51] Int. Cl.[6] .................................................. G11B 5/09
[52] U.S. Cl. ....................................... 369/59; 360/51
[58] Field of Search ............................. 369/47, 48, 49, 369/53, 54, 59, 60, 124; 360/27, 29, 30, 32, 39, 51

[56] References Cited

U.S. PATENT DOCUMENTS

| 4,961,182 | 10/1990 | Saito et al. | 369/124 |
| 5,502,711 | 3/1996 | Clark et al. | 369/124 |

*Primary Examiner*—P. W. Huber
*Attorney, Agent, or Firm*—Renner, Otto, Boisselle, Sklar

[57] ABSTRACT

A reproduced signal is digitized so as to count a time interval of a specified pattern simultaneously with the count of a clock period of a phase lock loop circuit. A phase lock loop clock frequency is subjected to a feedback control based on the information indicated the difference between the time interval and the clock period. In this manner, a frequency loop performs a feedback operation so that a frequency of the reproduced signal falls within a capture range of a phase lock-in, thereby increasing the speed of phase lock-in.

31 Claims, 22 Drawing Sheets

DATA DETECTION APPARATUS

BACKGROUND OF THE INVENTION

1. Field of the Invention

The present invention relates to a data detection apparatus for detecting the data reproduced from a disk apparatus or the like. More particularly, the present invention relates to a phase lock loop for reproducing a clock component included in a signal reproduced from an optical disk medium on which information is digitally recorded so that the linear recording density becomes approximately constant.

2. Description of the Related Art

Recently, information is more actively and widely digitized in the information-related field as well as in the audio-video field. Attention is focused on an optical disk as a medium for digitally recording audio information, video information or the like. The optical disk has excellent properties such as random access ability, medium exchangeability, capability of accommodating information and the like as compared with other medium such as other magnetic tapes or disks. As a method for recording the maximum information on such an optical disk, a constant linear velocity (CLV) recording method is used. According to the CLV recording method, the maximum recording capacity is realized within the same disk size by unifying and maximizing the bit recording density throughout a recordable region of the recording medium. In the case where the data recorded by the CLV recording method is to be reproduced, it is normally necessary to vary the rate of disk revolutions in accordance with a radius of a region to be reproduced, that is, a radius of a track so as to keep a reproduced data rate constant. The reproduced data rate is set to be a predetermined data rate by providing a phase lock loop for a clock component included in a reproduced signal so as to convert the reproduced signal into digital data and further providing a frequency loop for controlling a motor, which serves to lock the thus obtained clock frequency with a fixed frequency.

Since a capture range of the phase lock loop used for converting a reproduced signal into the digital data is normally small, that is, within the range of ±5%, it is necessary to control the number of revolutions with high precision in accordance with the radius of the track for performing a lock-in operation. However, since it is not easy to control the number of revolutions with high precision, it is difficult to establish the lock-in. As an example of a reproduced signal, when information is subjected to a digital modulation satisfying the (d, k) rule as used in a compact disk (in the case of a compact disk, d=2, k=10), and then is subjected to a Non Return to Zero, Inverse (NRZI) modulation, and is recorded in a Pit Width Modulation (PWM) in which the number of consecutive codes "1" and the positions thereof correspond to a pit length and a pit position, the data is reproduced based on a rising edge and a falling edge of the reproduced signal. By utilizing that these edges can be obtained at discrete time intervals determined by the (d, k) rule, clock information of the reproduced data is reproduced by using a phase lock loop.

A conventional data detection apparatus will be described with reference to FIG. 19. The data detection apparatus includes: an optical disk 18; a disk motor 19 for rotating the optical disk 18; an optical pick-up 20 for reproducing the information recorded on the optical disk 18; a digitizing section 1 for digitizing a reproduced signal at a predetermined voltage level so as to output a digital signal; an oscillator 5 for outputting a clock signal having a frequency proportional to a voltage output from a low pass filter 4; a phase comparing section 2 for comparing the phases between the digital signal and the clock signal so as to output a phase difference signal; a charge pump section 3 for discharging or absorbing a current in accordance with the phase difference signal; a low pass filter 4 for converting a current output from the charge pump section 3 into a voltage while limiting a frequency band thereof so as to input the obtained voltage to the oscillator; and a motor controller 21 for controlling the motor rotations.

The operation of the thus configured data detection apparatus will be described with reference to FIG. 20. A signal (a) reproduced from the optical disk 18 is digitized at a predetermined voltage level in the digitizing section 1 to be converted into a digital signal (b). The oscillator 5 has characteristics of oscillating a clock signal having a frequency proportional to an input voltage, for example, as shown in FIG. 21, and oscillates at a free-run frequency (c) prior to a lock-in. The phase comparing section 2 compares the phase of a digital signal and the phase of an oscillating clock signal. The phase comparing section 2 outputs a positive pulse (f) or a negative pulse (g) in accordance with the relation of the phases of the two inputs as shown in FIG. 22. More specifically, a positive pulse (f) is output in the case where the phase of the clock signal is ahead of that of the digital signal and a negative pulse (g) is output in the case where the phase of the digital signal is ahead of that of the clock signal, at time intervals in accordance with the phase difference. The charge pump section 3 outputs a positive or negative current in accordance with the amount of the phase difference. The charge pump section 3 includes current sources I1 and I2 and switches S1 and S2, for example, as shown in FIG. 23. The current source I1 allows a predetermined current to flow by rendering the switch S1 conductive with a negative pulse; while the current source I2 absorbs a predetermined current by rendering the switch S2 conductive with a positive pulse. The low pass filter 4 comprises a resistance R and a capacitance C, for example, as shown in FIG. 24. The low pass filter 4 converts a current output from the charge pump section 3 to a voltage while limiting a frequency band of the current. The oscillator 5 generates a clock signal having a frequency proportional to a voltage generated by the low pass filter 4. In this manner, in the case where the phase of the clock of the oscillator 5 is ahead of that of the digital signal, a positive pulse is output from the phase comparing section 2 to allow the charge pump section 3 to absorb the current. As a result, a filter voltage drops to lower the clock frequency output from the oscillator 5, thereby delaying the clock signal in terms of phase. On the other hand, in the case where the phase of the clock of the oscillator 5 is behind that of the digital signal, a negative pulse is output from the phase comparing section 2 to allow the current to flow from the charge pump section 3. As a result, a filter voltage boosts the clock frequency output from the oscillator 5, thereby advancing the clock signal in terms of phase. As described above, a negative feedback control functions so as to make the frequencies of the clock and the digital signal almost identical to each other. At last, the widths of a negative pulse and a positive pulse become respectively small to perform a phase lock-in of the digital signal (b) and the clock signal (d). Furthermore, in the case where the data is reproduced at a fixed transfer rate by performing the CLV control, the rotation of the motor is controlled so that an oscillation frequency obtained in the oscillator 5 of a phase-locked loop is used as a fixed frequency.

However, since the edge information of the digital signal is modulated in accordance with the recorded data, the edge information does not uniformly appear. Therefore, a pseudo lock of the phase lock loop occurs at a frequency other than a predetermined frequency. In order to avoid the pseudo lock, it is necessary to adjust the rotation of the motor so that a reproduced signal rate is almost equal to a predetermined rate.

The small range of the lock-in of a phase lock loop results from the following fact. The input data is subjected to pulse modulation, and is therefor discontinuous in terms of time. Thus, the lock-in can be performed only in terms of phase but not in terms of frequency.

In this way, the lock-in of a phase lock loop may be improved, and an apparatus which does not cause a pseudo lock is needed. Thus, a lock-in circuit requires the motor controller 21 to adjust the rotation of the motor so that a reproduced signal rate is almost within the capture range as shown in FIG. 25. For example, the shortest or longest pulse width of a reproduced signal is obtained by utilizing a rising edge and a falling edge of the reproduced signal (a), which can be obtained at discrete time intervals determined by the (d, k) rule as shown in FIG. 26. The motor controller 21 requires a circuit for controlling the rotation of the motor so that the obtained pulse width is set to a predetermined value. Since the disk rotates at high speed in the case where a pulse width is shorter than a predetermined width as represented by a pulse width (h), the rotation speed is decreased. Since the disk rotates at low speed in the case where a pulse width is longer than a predetermined width as represented by a pulse width (i), the rotation speed is increased. In this manner, the motor speed is controlled so that a reproduced signal rate is within a capture range.

With the above configuration, however, the response speed of the motor is low. Therefore, it takes much time to adjust the disk rotation so as to be within the capture range, and such time occupies a large part of seek time.

Although it might be possible to shorten the adjustment time until a steady-state rotation of the motor is obtained, there is a limitation in a motor torque and a driving current. Moreover, in the case where the motor rotation is controlled by detecting the shortest pulse width or the longest pulse width of a reproduced signal, it is necessary to preserve a detection sampling period for a predetermined time or longer because the frequency of appearances of the shortest or longest pulse with is restricted. Thus, it is difficult to increase the frequency band.

SUMMARY OF THE INVENTION

The apparatus of this invention for reproducing digital information which is subjected to modulation recording with a discrete record length, includes: a digitizing section for digitizing a reproduced signal at a predetermined level so as to output a digital signal; an oscillator for outputting a clock signal having a frequency proportional to an input signal; a phase comparing section for comparing the digital signal with the clock signal so as to output a first difference signal indicating a difference in phase between the digital signal and the clock signal; a specified pattern width detecting section for detecting a time interval of a specified pattern included in the digital signal so as to output first information indicating either a reproduced period for a reproduced frequency; an oscillating period detecting section for detecting a period of the clock signal so as to output second information indicating either an oscillating period or an oscillating frequency of the oscillator; a period comparing section for comparing the first information with the second information so as to output a second difference signal indicating a difference between the first information and the second information; an operating section for performing an operation in accordance with the first difference signal and the second difference signal; and a filter for limiting a frequency band of the output from the operating section so as to output a resultant signal as an input signal for the oscillator; wherein the apparatus has: a phase lock loop operating so that the clock signal is phase-locked with an edge of the digital signal by the oscillator, the phase comparing section, the operating section and the filter; and a frequency loop operating so that a clock period and reproducing period become almost identical to each other by the oscillator, the specified pattern width detecting section, the oscillating period detecting section, the period comparing section, the operating section and the filter. By detecting the time interval of the specified pattern included in the digital signal and the clock period of the oscillator, a frequency of the clock component included in the digital signal and the oscillating frequency of the oscillator become almost identical to each other by a frequency loop which feedbacks a relative difference between a reproduction rate of the disk reproduction and an oscillating clock rate of the oscillator. As a result, a phase lock-in can be certainly completed at high speed without causing the pseudo phase locking of the phase lock loop.

In one embodiment of the present invention, the specified pattern width detecting section counts the time interval of the specified pattern included in the digital signal with a fixed clock. As a result, the time interval of the specified pattern recorded onto the disk, that is, the reproduction linear velocity information is converted into a digital value.

In another embodiment of the present invention, the oscillating period detecting section counts a period of n cycles of the clock signal with a fixed clock, where n is a natural number, and has effect of converting the oscillating period into a digital value.

In still another embodiment of the present invention, the operation section is a voltage generator for receiving the first difference signal and the second difference signal so as to output a voltage in accordance therewith, and ha effect of converting the amount of phase difference and the amount of period difference into a voltage.

In still another embedment of the present invention, the operating section is a charge pump section for receiving the first difference signal and the second difference signal so as to discharge or absorb a current in accordance therewith, and has effect of converting the amount of phase difference and the amount of period difference into a current.

In still another embodiment of the present invention, the charge pump section includes an adder for receiving the first difference signal and the second difference signal so as to output a logical OR signal of the first and second difference signals, and a charge pump for discharging or absorbing a current in accordance with the logical OR signal, and has effect of adding the amount of phase difference and the amount of period difference by one charge pump so as to convert the amount of phase difference and the amount of period into a current value.

In still another embodiment of the invention, the charge pump section includes a first charge pump for discharging or absorbing a current having a first value in accordance with first difference signal and a second charge pump for discharging or absorbing a current having a second value in accordance with the second difference signal, and has effect of respectively converting the amount of phase difference and the amount of period difference into a current by independently provided charge pumps.

In still another embodiment of the present invention, the charge pump section includes a first hold control input for inhibiting a discharging and absorbing operation of a current in accordance with the first difference signal so as to stop a phase lock loop, a second hold control input for inhibiting a discharging and absorbing operation of a current in accordance with the second difference signal so as to stop a frequency loop, and a loop controller for outputting a control signal to the first hold control input and the second hold control input, and has effect of controlling the operations of the phase lock loop and the frequency loop by the first hold control input and the second hold control input.

In still another embodiment of the present invention, the oscillating period detecting section counts a period of n cycles of the clock signal with a clock having a 1/k frequency of the fixed clock, where n and k each is a natural number, and has effect of lowering the operation speed of the counter so as to lighten the load applied on the circuit.

In still another embodiment of the present invention, the apparatus further includes a synchronization detecting section for detecting a phase locked state between the clock signal and the digital signal so as to output a synchronization detection signal, wherein the loop controller operates the phase lock loop and the frequency loop in accordance with the synchronization detection signal. The loop controller operates the phase lock loop and the frequency loop in accordance with the synchronization detecting signal, and has effect of performing an optimal lock-in control in accordance with the phase locked state.

In still another embodiment of the present invention, the synchronization detecting section detects that a value obtained by integrating an absolute value of the first difference signal is at a level equal to or lower than a prescribed level. By using the phase difference information obtained by the phase comparator for detecting the synchronization, the detection can be performed in real time.

In still another embodiment of the present invention, the loop controller receives the second difference signal so as to control the phase lock loop and the frequency loop in accordance with the second difference signal. As a result, the optical lock-in control can be performed in accordance with a period difference.

In still another embodiment of the present invention, the apparatus further includes a synchronizing section for receiving the digital signal and the clock signal so as to output reproduced data in which the digital signal is synchronized with the clock signal and a pattern detecting section for receiving the clock signal and the reproduced signal so as to detect the presence of a periodic pattern periodically included in the reproduced data and whether the pattern has a periodicity, wherein the loop controller receives a signal output from the pattern detecting section so as to operate the phase lock loop and the frequency loop in accordance with the signal. As a result, the optimal lock-in control can be performed in accordance with the detected state of the periodic pattern.

In still another embodiment of the present invention, the apparatus includes a synchronization detecting section for detecting a phase locked state between the clock signal and the digital signal so as to output a synchronization detection signal, a synchronizing section for receiving the digital signal and the clock signal so as to output reproduced data in which the digital signal is synchronized with the clock signal, and a pattern detecting section for receiving the clock signal and the reproduced signal so as to detect the presence of a periodic pattern periodically included in the reproduced data and whether the pattern has a periodicity, wherein the loop controller receives a signal output from the pattern detecting section so as to operate the phase lock loop and the frequency loop in accordance with the signal. As a result, the optimal lock-in control can be performed in accordance with the detected state of the synchronization state and the periodic pattern.

In still another embodiment of the present invention, the apparatus further includes: a synchronizing section for receiving the digital signal and the clock signal so as to output reproduced data synchronized with the clock signal; and a pattern detecting section for receiving the clock signal and the reproduced data so as to detect the presence of a periodic pattern periodically included in the reproduced data, wherein the loop controller receives the second difference signal and a signal output from the pattern detecting section so as to operate the phase lock loop and the frequency loop in accordance therewith. As a result, the optimal lock-in control can be performed in accordance with the detected state of the period difference and the periodic pattern.

In still another embodiment of the present invention, the apparatus further includes a synchronization detecting section for detecting a phase locked state between the clock signal and the digital signal so as to output a synchronization detecting signal, wherein the loop controller receives the second difference signal and the synchronization detecting signal so as to operate the phase lock loop and the frequency loop in accordance therewith. As a result, the optimal lock-in control can be performed in accordance with the detected state of the period difference and the synchronized state.

In still another embodiment of the present invention, the apparatus further includes: a synchronization detecting section for detecting a phase locked state between the clock signal and the digital signal so as to output a synchronization detecting signal; a synchronizing section for receiving the digital signal and the clock signal so as to output reproduced data in which the digital signal is synchronized with the clock signal; and a pattern detecting section for receiving the clock signal and the reproduced data so as to detect the presence of a periodic pattern periodically included in the reproduced data and whether the pattern has a periodicity, wherein the loop controller receives the second difference signal, the synchronization detecting signal and an output from the pattern detecting section so as to operate the phase lock loop and the frequency loop in accordance therewith. As a result, the optimal lock-in control can be performed in accordance with the detected state of the periodic difference, the synchronized state and the periodic pattern.

In still another embodiment of the present invention, the loop controller receives the synchronization detecting signal or a signal output from the pattern detecting section as a second hold control input for the charge pump section and receives the second difference signal as a first hold control input for the charge pump section, wherein, upon a phase lock-in, the phase lock loop is inhibited from operating while still allowing the frequency loop to operate until the second difference signal falls within a prescribed range, both the phase lock loop and the frequency loop are operated when the second difference signal falls within the prescribed range, and the frequency loop is inhibited from operating while allowing the phase lock loop to operate when a periodic pattern is detected by the synchronization detecting signal or the pattern detecting section. As a result, the optimal lock-in control can be performed in accordance with the detected state of the synchronization detecting signal or the periodic pattern and the period difference.

In still another embodiment of the present invention, the loop controller receives the synchronization detecting signal or a signal output from the pattern detecting section as a second hold control input for the charge pump section and receives the second difference signal as a first hold control input for the charge pump section, wherein, upon a phase lock-in, the phase lock loop is inhibited from operating while still allowing the frequency loop to operate until the second difference signal falls within a prescribed range, both the phase lock loop and the frequency loop are operated when the second difference signal falls within the prescribed range, the frequency loop is inhibited from operating while allowing the phase lock loop to operate when a phase locked state is detected by the synchronization detecting signal or a periodic pattern is detected by the pattern detecting section, and both the phase lock loop and the frequency loop are operated when the phase locked state or the periodic pattern is not detected by the synchronization detecting signal any more. As a result, the optimal lock-in control can be performed in accordance with the detected state of the synchronization detecting signal or the periodic pattern and the period difference.

In still another embodiment of the present invention, the loop controller receives the synchronization detecting signal or the output from the pattern detecting section as a second hold control input for the charge pump section and receives the second difference signal as a first hold control input for the charge pump section, wherein, upon a phase lock-in, the phase lock loop is inhibited from operating while still allowing the frequency loop to operate until the second difference signal falls within a prescribed range, both the phase lock loop and the frequency loop are operated when the first difference signal falls within the prescribed range, the frequency loop is inhibited from operating while allowing the phase lock loop to operate when a periodic pattern is detected by the synchronization detecting signal or the pattern detecting section, and both the phase lock loop and the frequency loop are operated when the phase locked state is not detected by the synchronization detecting signal or the periodic patter is not detected by the pattern detecting section. As a result, the optimal lock-in control can be performed in accordance with the detected state of the synchronization detecting signal or the periodic pattern and the periodic difference.

In still another embodiment of the present invention, the loop controller receives the synchronization detecting signal or a signal output from the pattern detecting section as a second hold control input for the charge pump section and receives a tracking on signal of a disk drive as a first hold control input for the charge pump section, wherein, upon a phase lock-in, the phase lock loop is inhibited from operating while still allowing the frequency loop to operate in a tracking off state, both the phase lock loop and the frequency loop are operated in a tracking on state, and the frequency loop is inhibited from operating while allowing the phase lock loop to operate when a phase locked state is detected by the synchronization detecting signal or a periodic pattern is detected by the pattern detecting section. As a result, the optimal lock-in control can be performed in accordance with the detected state of the synchronization detecting signal or the periodic pattern and the tracking.

In still another embodiment of the present invention, the loop controller receives the synchronization detecting signal or the signal output from the pattern detecting section as a second hold control input for the charge pump section and receives a tracking on signal of a disk drive as a first hold control input for the charge pump section, wherein, upon a phase lock-in, the phase lock loop is inhibited from operating while still allowing the frequency loop to operate in a tracking off state, both the phase lock loop and the frequency loop are operated in a tracking on state, the frequency loop is inhibited from operating while allowing the phase lock loop to operate when a phase locked state is detected by the lock detecting signal or a periodic pattern is detected by the pattern detecting section, and the phase lock loop and the frequency loop are operated when the periodic pattern is not detected. As a result, the optimal lock-in control can be performed in accordance with the detected state of the synchronization detecting signal or the periodic pattern and the tracking.

In still another embodiment of the present invention, the loop controller receives the synchronization detecting signal or the signal output from the pattern detecting section as a second hold control input for the charge pump section and receives a tracking on signal of a disk drive as a first hold control input for the charge pump section, wherein, upon a phase lock-in, the phase lock loop is inhibited from operating while still allowing the frequency loop to operate in a tracking off state, both the phase lock loop and the frequency loop are operated in a tracking on state, the frequency loop is inhibited from operating while allowing the phase lock loop to operate when a phase locked state is detected by the synchronization detecting signal or a period pattern is detected by the pattern detecting section, and the phase lock loop is inhibited from operating while allowing the frequency loop to operate when the periodic pattern is not detected by the pattern detection section any more. As a result, the optimal lock-in control can be performed in accordance with the detected state of the synchronization detecting signal or the periodic pattern and the tracking.

In still another embodiment of the present invention, the charge pump section discharges or absorbs a predetermined current for a predetermined time in accordance with a polarity of the second difference signal output from the period comparing section for each predetermined period. By controlling the absorbing or discharging time of current, a gain in the frequency loop can be set to a predetermined level.

In still another embodiment of the present invention, the charge pump section outputs a current for a predetermined time proportional to the second difference signal output from the period comparing section for each predetermined period. By controlling the amount of a current, a gain in the frequency loop is determined so as to be proportional to the frequency difference.

In still another embodiment of the present invention, the charge pump section discharges or absorbs a predetermined current for a predetermined time in accordance with a polarity of the second difference signal output from the period comparing section for each predetermined period under control at a time interval proportional to an absolute value of the second difference signal. By controlling the absorbing or discharging time of current, a gain in the frequency loop can be set to be proportional to the frequency difference.

In still another embodiment of the present invention, the phase comparing section includes: a period detector for outputting a signal proportional to an oscillating period of the oscillator; a delay circuit for delaying the digital signal proportional to an output from the period detecting section; a pulse gate circuit for outputting clock edge information of an oscillating output from the oscillator only when the digital signal is input; an phase difference detector for comparing a phase of an output from the delay circuit and a phase of the output from the pulse gate circuit so as to generate two pulses representative of positive or negative in accordance with whether a phase difference is plus or minus with a pulse width in accordance with the amount of the phase difference, and wherein the amount of delay of the delay circuit is controlled so as to be proportional to an oscillating period of the oscillator. By controlling the amount of delay in the phase comparator proportional to the oscillating period of the oscillator, a positive and negative phase comparing range can be symmetrically set so as to range from $-\pi$ to $+\pi$.

In still another embodiment of the present invention, the amount of delay of the delay circuit is controlled so as to be proportional to the oscillating period of the oscillator and is capable of being held by an external signal. Even in the case where a clock frequency is disordered against the disturbance such as drop out, such a disturbance is detected so as to hold the amount of delay of the phase comparator, thereby stabilizing the phase comparing operation.

In still another embodiment of the present invention, the amount of delay of the delay circuit is controlled so as to be proportional to the oscillating period of the oscillator and is switchable to a prescribed amount of delay by an external signal. Even in the case where a clock frequency is disordered against the disturbance such as drop out, such a disturbance is detected so as to restore the amount of delay of the phase comparator to a prescribed value, thereby stabilizing the phase comparing operation.

In still another embodiment of the present invention, the amount of delay of the delay circuit is controlled so as to be proportional to a current or a voltage proportional to the oscillating period of the oscillator which is subjected to low pass filtration. As a result, the phase comparing operation can be stabilized without being affected by the disorder of a high frequency of the oscillator.

In still another embodiment of the present invention, the phase comparing section includes: a digital-analog convertor for outputting a current or a voltage proportional to a count value of the specified pattern width detecting section; a delay circuit for providing the amount of delay proportional to an output from the digital to analog convertor; a pulse gate circuit for outputting clock edge information serving as an output of the oscillator only when the digital signal is input; and a phase difference detector for comparing a phase of an output from the delay circuit and a phase of the output from the pulse gate circuit so as to generate two pulses, which are representative of positive or negative in accordance with whether a phase difference is plus or minus, with a pulse width in accordance with the amount of the phase difference, and wherein the amount of delay of the delay circuit is controlled proportional to a count value of the specified pattern width detecting section. By controlling the amount of delay in the phase comparator proportional to the oscillating period of the clock component of the oscillator, a positive and negative phase comparing range can be symmetrically set so as to range from $-\pi$ to $+\pi$.

According to the present invention, the data detection apparatus includes: a digitizing section for digitizing a reproduced signal at a predetermined voltage level so as to output a digital signal; an oscillator for outputting a clock signal having a frequency proportional to an input signal; a phase comparing section for comparing phases between the digital signal and the clock signal so as to output a phase difference signal; a specified pattern width detecting section for detecting a time interval of a specified pattern included in the digital signal so as to output reproduced period (or reproduced frequency) information; an oscillating period detecting section for detecting a period of the clock signal so as to output oscillating period (or oscillating frequency) information; a period comparing section for comparing the output from the specified pattern width detecting section and the output from the oscillating period detecting section so as to output a period difference signal; an operating section for receiving the phase difference signal and the period difference signal so as to perform an operation in accordance with each of the signals; and a filter for limiting a frequency bond of the output from the operating section so as to transmit a suitable input signal for the oscillator.

With the above configuration, the shortest or the longest pulse width of a reproduced signal is obtained. Simultaneously, a clock period of the oscillator is obtained. The data apparatus can perform both a frequency lock-in operation for locking-in a frequency of the oscillator within a range capable of performing a phase lock in and a phase lock-in operation. As a result, the reproduction of a clock signal at high speed can be ensured.

Thus, the invention described herein makes possible the advantage of providing a data detection apparatus having both a frequency loop and a phase lock loop, capable of reducing the time required until a phase lock-in is performed and remarkably reducing seek time.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of an illustrative examples.

EXAMPLE 1

A data detection apparatus 100 of the present invention will be described in detail with reference to the drawings.

Figure 1:
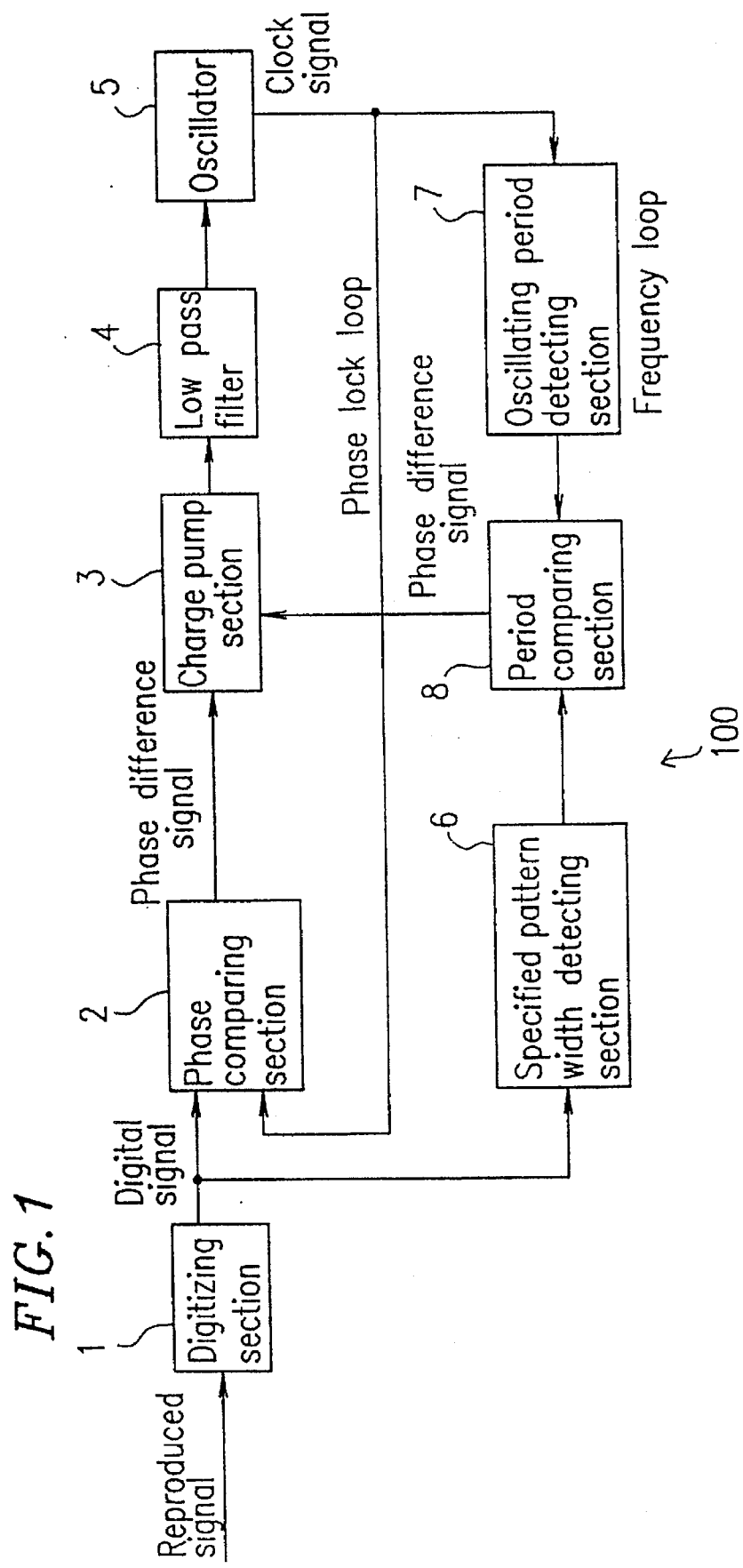
FIG. 1 is a block diagram showing a data detection apparatus in Example 1 of the present invention.

FIG. 1 is a block diagram showing the data detection apparatus 100. The data detection apparatus 100 includes: a digitizing section 1 for digitizing a reproduced signal at a predetermined voltage level to output a digital signal; an oscillator 5 for outputting a clock signal having a frequency proportional to the voltage output from a low pass filter 4; a phase comparing section 2 for comparing phases between the digital signal and the clock signal to output a phase difference signal; a charge pump section 3 for discharging or absorbing a current in accordance with the phase difference signal; the low pass filter 4 for converting the current output from the charge pump section 3 into a voltage simultaneously with limiting a frequency band thereof; a specified pattern width for counting a length of a specified pattern included in the digital signal, for example, a length of the longest mark, with a fixed clock so as to output the result of the count; an oscillating period detecting section 7 for counting an oscillating period of the oscillator 5 with the fixed clock so as to output the result of the count; and a period comparing section 8 for comparing the count value output from the specified pattern width detecting section 6 and the count value output from the oscillating period detecting section 7 so as to output a period difference signal.

Figure 2:
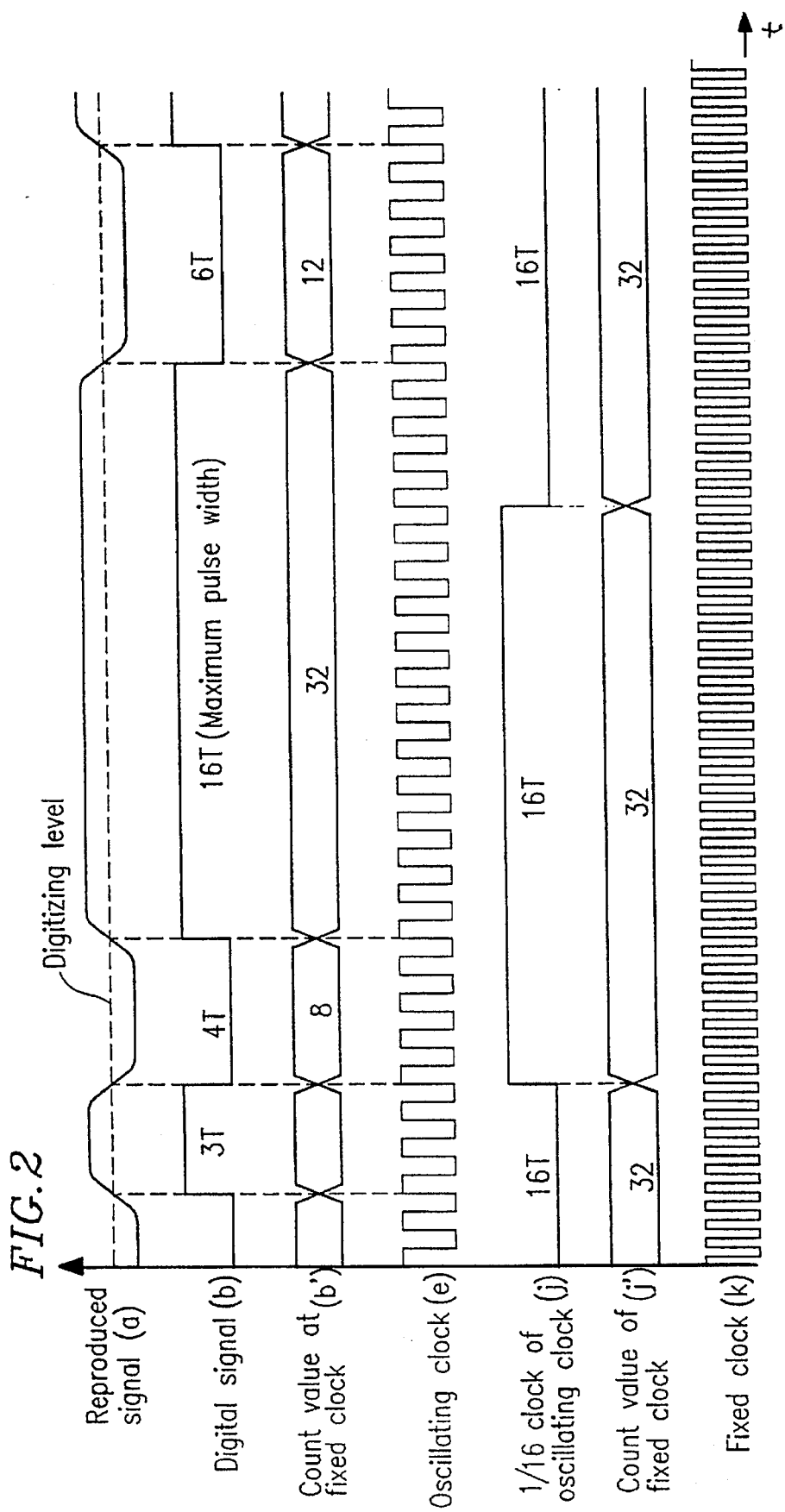
FIG. 2 is a timing chart for illustrating the operation of the data detection apparatus in Example 1 of the present invention.

Next, the operation of the data detection apparatus 100 will be described with reference to FIG. 2. FIG. 2 shows the steady-state reproduction state. It is assumed that a reproduced signal is obtained by reproducing the data which is subjected to a pit width modulation and then recorded by the CLV method onto a disk. The reproduced signal (a) is digitized at a predetermined level in the digitizing section 1 so as to be a digital signal (b). In order to reproduce the data from the digital signal, it is necessary to extract a clock component phase-locked with the digital signal. Due to the characteristics of digital modulation, a distance between the edges of the digital signal is an integer multiple of a clock period, and has a discrete value depending on the recorded data. Since the spectrum of the digital signal spreads, it is difficult to detect a frequency component. Therefore, it is not possible to perform a frequency lock-in with the phase lock loop including the digitizing section 1, the phase comparing section 2, the charge pump section 3, the low pass filter 4 and the oscillator 5. The lock-in can be performed only in terms of phase. The principle of the phase lock-in is as described in the conventional method.

In order to obtain a phase-locking between the digital signal and the clock signal, it is necessary that a frequency of a clock component included in the digital signal and a frequency of a clock signal output from the oscillator b are substantially identical to each other with a precision of about ±5%. In the case where these signals greatly differ from each other in terms of frequency, it is not possible to lock these signals in a standard frequency. There is a possibility that the signals are locked in a pseudo stable point. Thus, a normal lock-in cannot be expected.

For example, in the case where such a modulation rule that the maximum edge interval of the digital signal is about 16 times that of the clock period (represented by 16T, where T is one clock period), the maximum value of the edge interval of the digital signal is counted for each predetermined detection period with a fixed clock so as to prevent the aforementioned pseudo lock-in. Then, the specified pattern width detecting section 6 obtains the period information of the lock component included in the digital signal from the count value, and the oscillating period detection section 7 counts a period of 16 cycles of the oscillating clock of the oscillator 5 with a fixed clock so as to obtain clock period information. Based on these two results, the period comparing section 8 compares the 16T period of the digital signal with the period of 16 cycles of the oscillating clock of the oscillator 5. In the case where the 16T period is greater than a period of 16 cycles of the oscillating clock of the oscillator 5, that is, a frequency of the oscillator 5 is lower than that of the clock component included in the digital signal, the charge pump section 3 is allowed to operate so as to increase the frequency of the oscillator 5. In the case where the 16T period is smaller than a period of 16 cycles of the oscillating clock of the oscillator 5, that is, the frequency of the oscillator 5 is higher than that of the clock component included in the digital signal, the charge pump section 3 is allowed to operate so as to lower the frequency of the oscillator. In this manner, the frequency loop serves to perform a lock-in of the lock component included in the digital signal for the oscillating clock of the oscillator 5 in terms of frequency.

Figure 3:
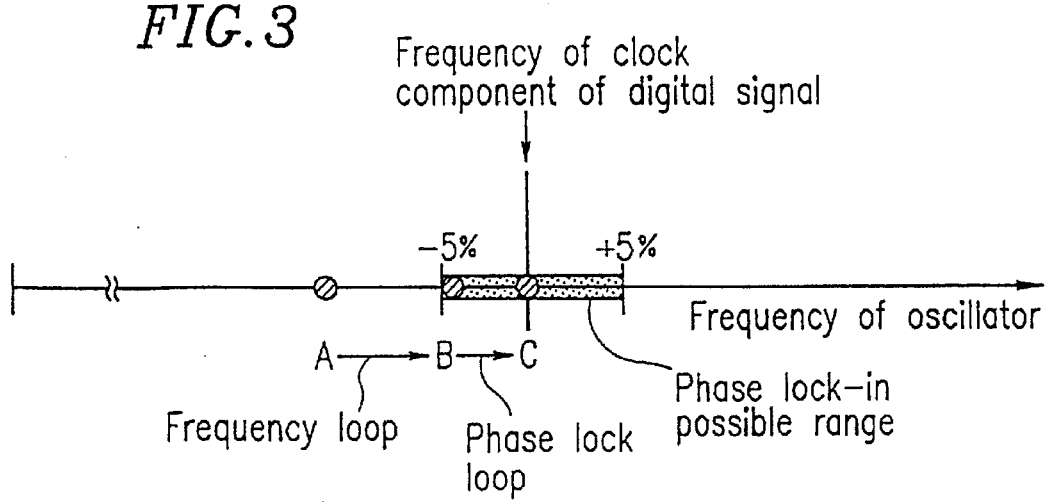
FIG. 3 is a diagram for illustrating the operation of a frequency loop and a phase lock loop.

FIG. 3 shows the operation of a frequency loop and a phase lock loop. Since the frequency of the clock component of the digital signal differs from that of the oscillator 5 (point A), the frequency loop is operated prior to the operation of the phase lock loop so as to set a frequency deviation between the frequency of the clock component included in the digital signal and the clock frequency of the oscillator to be within the range allowing a phase lock-in, that is, within about ±5% (point B). Thereafter, if the phase lock loop is operated from point B, it is possible to perform a normal lock-in, but not a pseudo lock-in (point C).

The precision of a frequency lock-in depends on the frequency of a fixed clock. As the fixed clock frequency increases, the detection precision increases. Thus, it is necessary to determine a fixed clock frequency in view of the capture range. In the case where a modulation rule, in which the maximum edge interval of the digital signal is 16 times the clock period (16T), is used, by setting a frequency of a fixed clock used for counting is set to be twice a frequency of an oscillating clock of the oscillator 5 during steady-state rotation, a detection precision of 1/32, i.e., about 3.1%, can be obtained. Therefore, it is sufficiently satisfy the capture range of ±5%.

However, a detection period of the specified pattern width detecting section 6 should include at least one maximum edge interval of the digital signal. For example, in the case wherein the rotation of the disk is varied to be half the steady state rotation due to seek or the like during reproduction of the disk, it is necessary to have a double detection period because a probability of appearances of the maximum edge interval is halved.

Moreover, by obtained the maximum or minimum value (in the case of Example 1, the minimum value) of a plurality of adjacent detection sections in the specified pattern width detection, a detection error occurring due to a defect on the disk can be eliminated.

Although the maximum edge interval of the digital signal is 16T in this example, a recording mark of another edge interval, for example 14T, can be also used. Alternatively, adjacent edge intervals may be added, and a recording mark of the sum of these edge intervals, for example (14T+4T), may be used instead.

As described above, according to Example 1, the phase lock loop and the frequency loop are provided. Since the frequency loop operates so that the frequency of the clock component included in the digital signal becomes almost identical to the oscillation frequency of the oscillator 5 prior to the operation of the phase lock loop, the phase lock operation is ensured without causing a pseudo phase lock. Moreover, unlike a conventional method for operating the phase lock loop to perform a lock-in after adjusting the rotation of a motor, a phase lock-in is performed after a reproduced data rate and an oscillation frequency of the oscillator 5 are made close to each other prior to the steady-state rotation of the motor in Example 1. Thus, the time required before a lock-in is performed can be greatly shortened.

The specified pattern width detecting section 6 and the oscillating period detecting section 7 both count and detect a period with a fixed clock in Example 1. Even when a clock signal output from the oscillator 5 is used as a count clock for the specified pattern width detecting section 6, it is possible to obtain a relative relationship of length between a specified pattern width and an oscillation clock period. Therefore, a similar operation can be performed. In this case, however, since the detection period depends on a probability of the presence of a specified pattern which is generally low, a detection period tend to be long. As a result, a frequency band is limited, thereby reducing the advantages of the present invention.

In the specified pattern width detection, a signal obtained by a digital signal, that is, a signal reproduced from a disk is detected. Therefore, the fluctuation in the detected value of the specified pattern width is similar to that of response speed of a disk motor, that is, about several tens of Hz. Thus, it is sufficient that a sampling frequency for detection corresponds to the fluctuation of the detected value. For example, in the case where the frequency of appearances of a specified pattern is 1 kHz, no problem occurs because this value is sufficiently high in view of the response speed of the motor. Although a response band of the oscillator 5 depends on the design of a lock loop, it is normally set to about several tens of KHz. Therefore, the fluctuation of the detected vale of the oscillation clock period is similar to the response band of the oscillator 5. A sampling frequency for detection is at least twice or more the response band of the oscillator 5 in view of a sampling theorem.

If a method for obtaining the relative relationship of length between a specified pattern width and an oscillation clock period by using a clock signal output from the oscillator 5 as a count of the specified pattern width detecting section 6 is employed, a period for detecting the period of the oscillator 5 becomes substantially identical to a period detected in the specified pattern detection. Therefore, it is impossible to control the oscillator 5 based on such a result of the detection.

On the other hand, if a method for counting an oscillating clock period of the oscillator 5 with a fixed clock as shown in FIG. 1 is used, it is possible to detect an oscillating period by using a period of 16 cycles of the oscillating signal of the oscillator 5 (for example, 640 ns in the case where such a modulation rule that a predetermined data rate is 25 MHz and the maximum edge interval of a digital signal is 16 times the clock period is used). Therefore, a sufficient sampling frequency can be realized with respect to the response of the oscillator 5, and it is possible to satisfactorily control the oscillator 5 with the result of detection. By independently providing a frequency loop as described in Example 1, the reduction of lock-in time and the stability of control can be simultaneously realized.

Since the phase lock loop and the frequency loop have the low pass filter, the shock generated by switching between the phase lock loop and the frequency loop is absorbed by the low pass filter. As a result, smooth switching between the loops can be realized.

Figure 4:
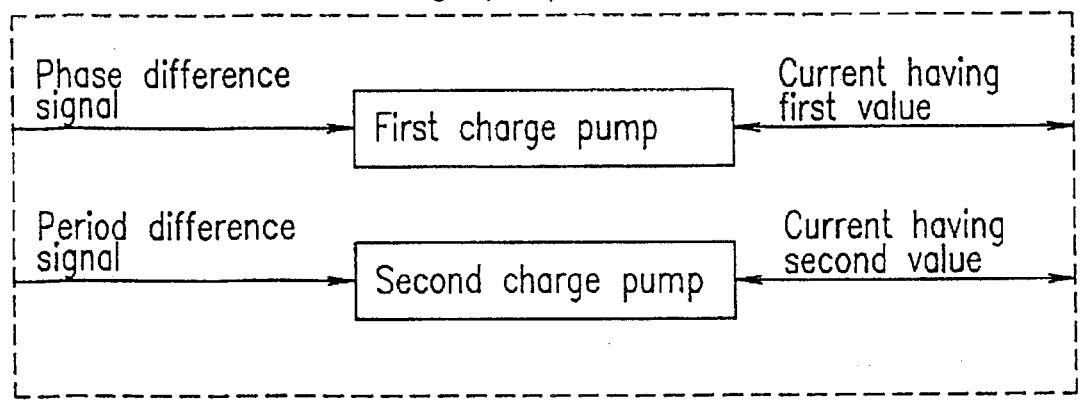
FIG. 4 is a block diagram showing charge pumps independently provided for the frequency loop and the phase loop.

Although only one charge pump is provided in Example 1, a first charge pump for a phase lock loop and a second charge pump for a frequency loop can be independently provided as shown in FIG. 4. As a result, it is possible to independently set a gain of the phase lock loop and a gain of the frequency loop. Therefore, the loops can be more freely designed.

Figure 5:
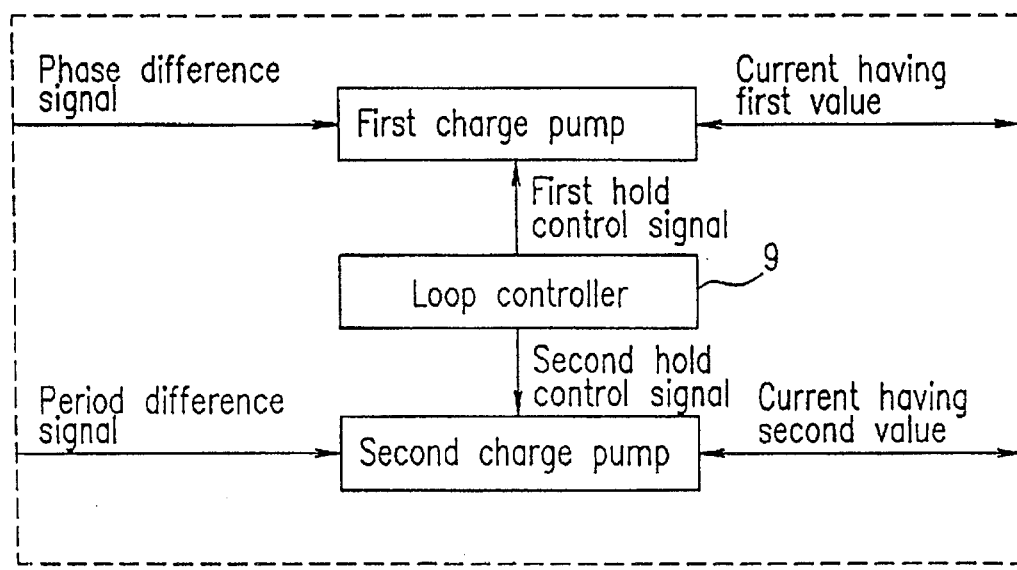
FIG. 5 is a block diagram showing the charge pumps capable of switching the loop operation.

The operations of the frequency loop and the phase lock loop are stopped by inhibiting the charge pump section from outputting a current. As shown in FIG. 5, the loop controller 9 outputs a first hold signal for inhibiting the first charge pump from outputting a current and a second hold signal for inhibiting the second charge pump from outputting a current. The frequency loop ad the phase lock loop may be respectively controlled by the first hold signal and second hold signal.

Figure 6:
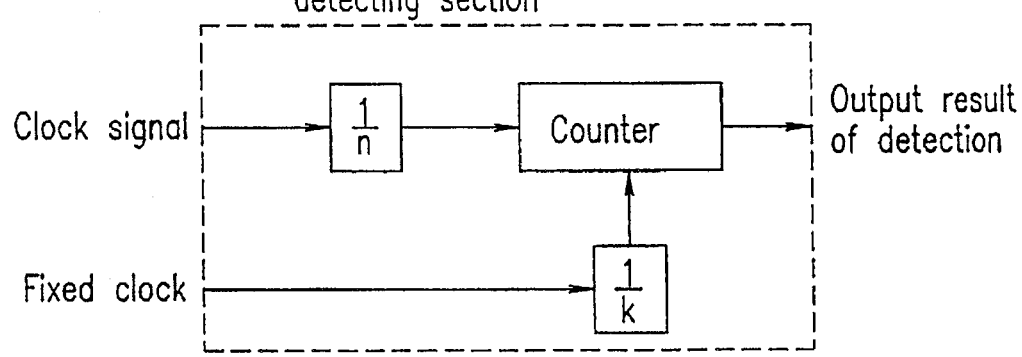
FIG. 6 is a block diagram showing a specified pattern width detecting section.

In the specified pattern width detecting section, a clock signal output from the oscillator 5 and a fixed clock for count may be divided prior to detection as shown in FIG. 6. As a result, it is possible to keep an operation frequency of a count circuit low. If a divisor for the frequency of the oscillator 5 is set to be greater than that of a fixed clock, it is possible to enhance the precision of the detection.

Figure 7:
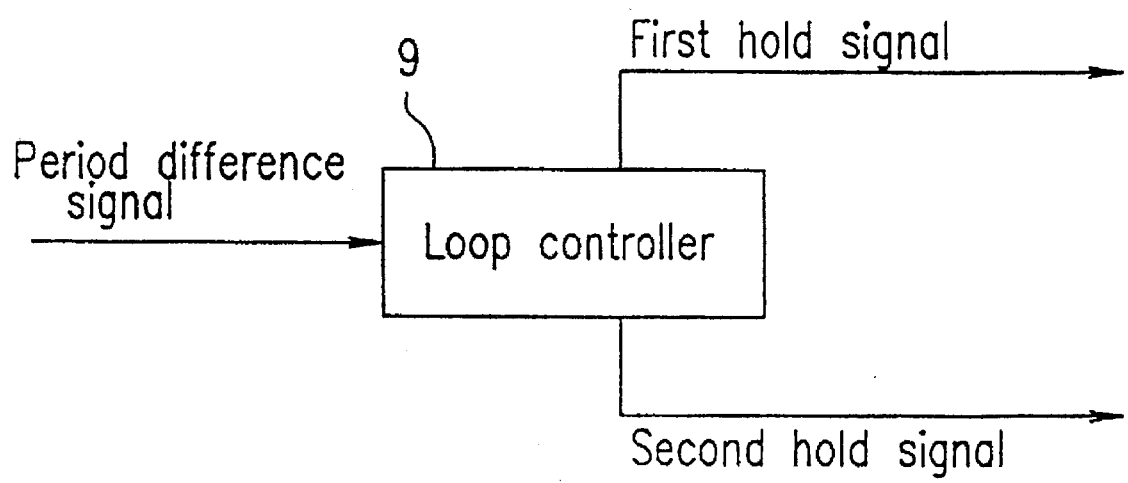
FIG. 7 is a diagram showing input and output signals of a loop controller.

The loop controller 9 may generate a first hold signal for inhibiting the first charge pump from outputting a current and a second hold signal for inhibiting the second charge pump from outputting a current based on a period difference signal as shown in FIG. 7. When a period difference is large, the first hold signal stops the operation of the phase lock loop while still allowing the frequency loop to operate, thereby bringing the period of the clock component included in the digital signal and the clock period of the oscillator 5 close the each other. When the period difference falls within the capture range, the first hold signal is cancelled so as to allow the phase lock loop to operate. At the time when the phase lock loop performs a lock-in, for example, when a period difference becomes zero, the second hold signal inhabits the second charge pump from outputting a current so as to stop the operation of the frequency loop. In this manner, the lock-in operation can be ensured. It may be possible to immediately switch the frequency loop to the phase lock loop. However, by allowing both the frequency loop and the phase lock loop to operate at the time of switching, smooth switching between the two loops can be more stably ensured.

EXAMPLE 2

Example 2 of the present invention will be next described.

Figure 8:
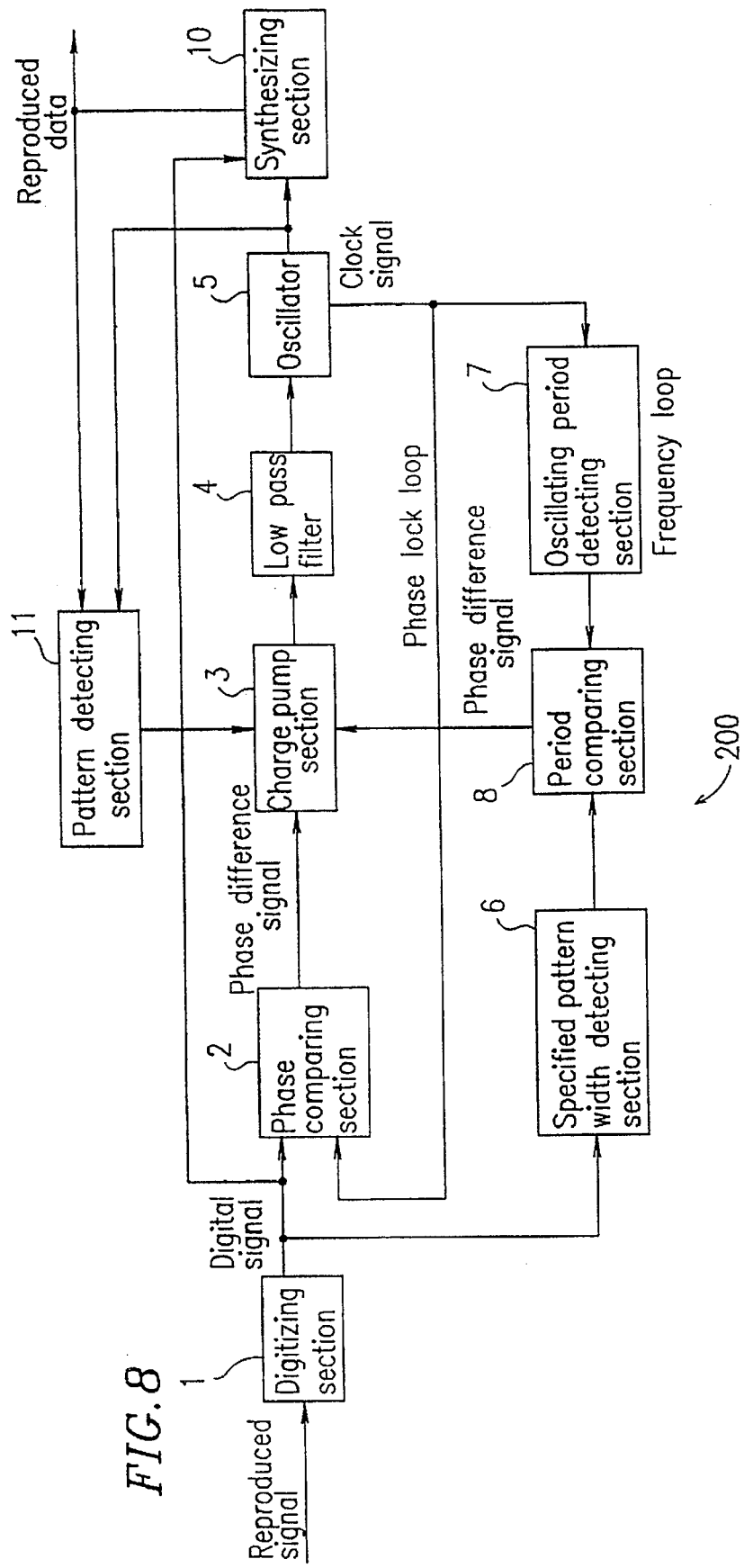
FIG. 8 is a block diagram showing a data detection apparatus in a second example of the present invention.

FIG. 8 is a block diagram showing a data detection apparatus 200 of Example 2. In FIG. 8, the components having the same functions as those in FIG. 1 are denoted by the same reference numerals. The data detection apparatus 200 includes: the digitizing section 1 for digitizing a reproduced signal at a predetermined voltage level to output a digital signal; the oscillator 5 for outputting a clock signal having a frequency proportional to the voltage output from the low pass filter 4; the phase comparing section 2 for comparing phases between the digital signal and the clock signal so as to output a phase difference signal; the charge pump section 3 for discharging or absorbing a current in accordance with the phase difference signal; the low pass filter 4 for converting the current output from the charge pump section 3 into a voltage simultaneously with limiting a frequency band thereof; the specified pattern width detecting section 6 for counting a length of a specified pattern included in the digital signal, for example, a length of a longest mark, with a fixed clock so as to output the result of the count; the oscillating period detecting section 7 for counting an oscillating period of the oscillator 5 with the fixed clock output the result of the count; and the period comparing section 8 for comparing the calculated value output from the specified pattern width detecting section 6 and the calculated value output from the oscillating period detecting section 7 so as to output a period difference signal. These components are the same as those included in the data detection apparatus 100 shown in FIG. 1. In Example 2, the data detection apparatus 200 further includes: a synchronizing section 10 for synchronizing a digital signal with a clock signal output from the oscillator 5 so as to generate the reproduced data synchronous with the clock signal; and a pattern detecting section 11 for receiving the clock output from the oscillator 5 and the reproduced data to detect a fixed pattern included in the reproduced data so as to detect the phase-locked state of the phase lock loop.

The pattern detecting section 11 detects the presence of a fixed pattern and the periodicity thereof by using a synchronous mark for synchronizing the entire data recorded for each constant period in the reproduced data. The detection is performed by reading out the reproduced data output from the synchronizing section 10 with the clock signal output from the oscillator 5.

In the case where a period of a clock component included in the digital signal and a period of a clock signal output from the oscillator 5 differ from each other, a fixed pattern is not detected. When the periods become close to each other, a fixed pattern is detected. Furthermore, in a phase-locked state, a period in which a fixed pattern is detected is counted with a period of the clock signal output from the oscillator 5, whereby a predetermined count value is obtained. In the case where phases are not locked, however, a detected period of the fixed pattern does not serve as a predetermined count period due to a minute difference between the periods (or frequencies). Therefore, if the fixed pattern is detected and the period in which the fixed pattern is detected is a predetermined period, it can be determined that it is in a phase-locked state.

The operation of the data detection apparatus 200 shown in FIG. 8 will be described. The basic phase lock-in method is the same as that in Example 1. In the case where a period difference is large, the operation of the phase lock loop is stopped while still allowing the frequency loop to operate, whereby the period of the clock component included in the digital signal and the period of the clock signal output from the oscillator 5 are brought close to each other. When a period difference falls within the capture range, the phase lock loop is allowed to continue operating. At the time when the pattern detecting section 11 confirms the locking of the phase lock loop, the second hold signal inhibits the second charge pump from outputting a current so as to stop the operation of a frequency loop. The operation sequence of the frequency loop and the phase lock loop is shown in FIG. 9.

By switching (the frequency loop+the phase lock loop) to (the phase lock loop) with high precision by using the pattern detecting section 11, the reliability of the data detection apparatus can be improved.

In Example 2, the timing of switching from (the frequency loop) to (the frequency loop+the phase lock loop) is determined in accordance with a period difference. It is also possible to determine the timing of switching based on a tracking on signal or the like of the disk drive. The timing of switching from (the frequency loop+the phase lock loop) to (the phase lock loop) is determined by confirming the phase lock-in by using the pattern detection. However, other methods may be also used as long as the phase locked state of the phase lock loop can be confirmed. For example, a method for integrating the amount of an absolute value of a phase difference signal is used. In this method, the value obtained by the integral calculus is equal to or lower than a prescribed level, it is judged that the phase locked state is obtained.

Figure 9:
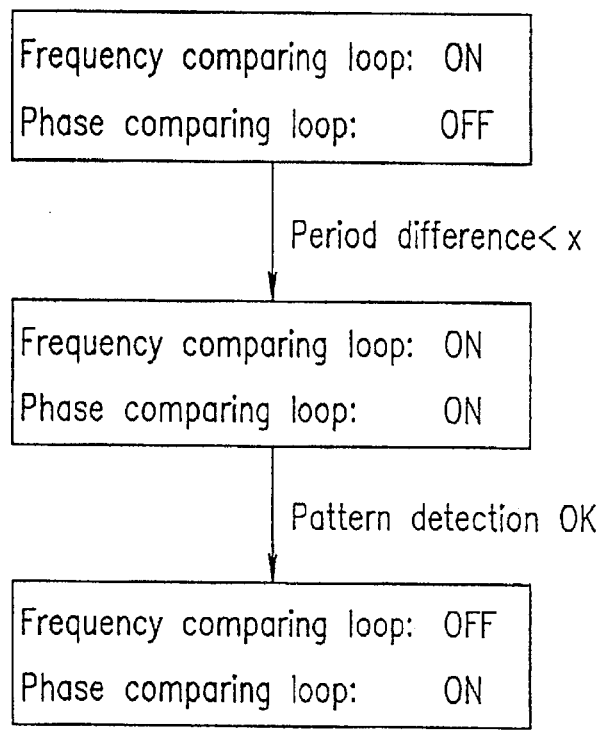
FIG. 9 is a diagram showing an operation sequence of the frequency loop and the phase lock loop.
Figure 10:
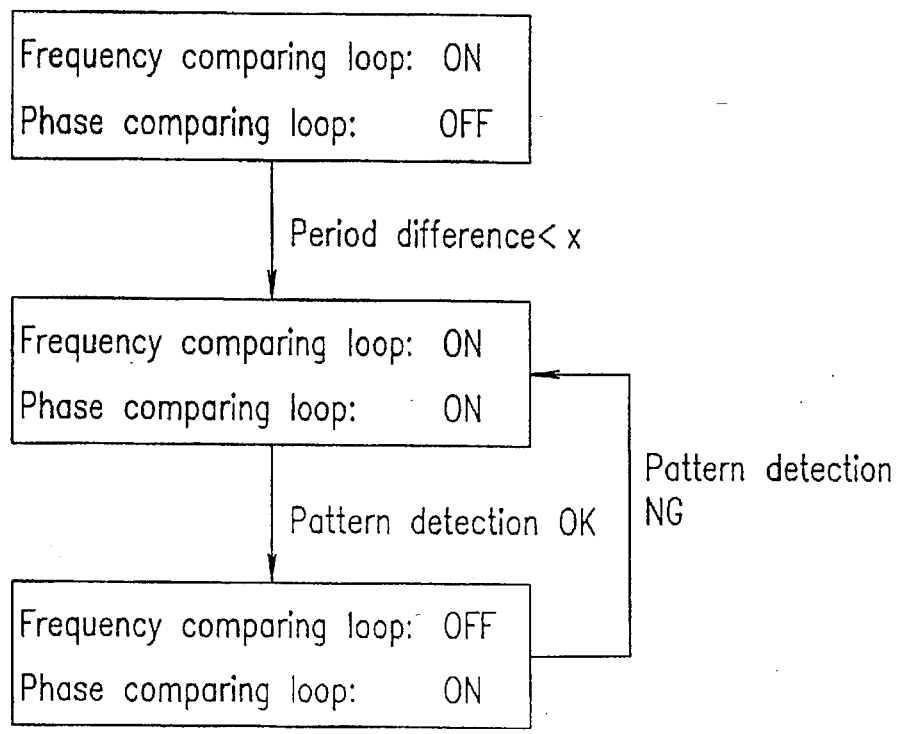
FIG. 10 is a diagram showing an example of an operation sequence when a disturbance occurs.
Figure 11:
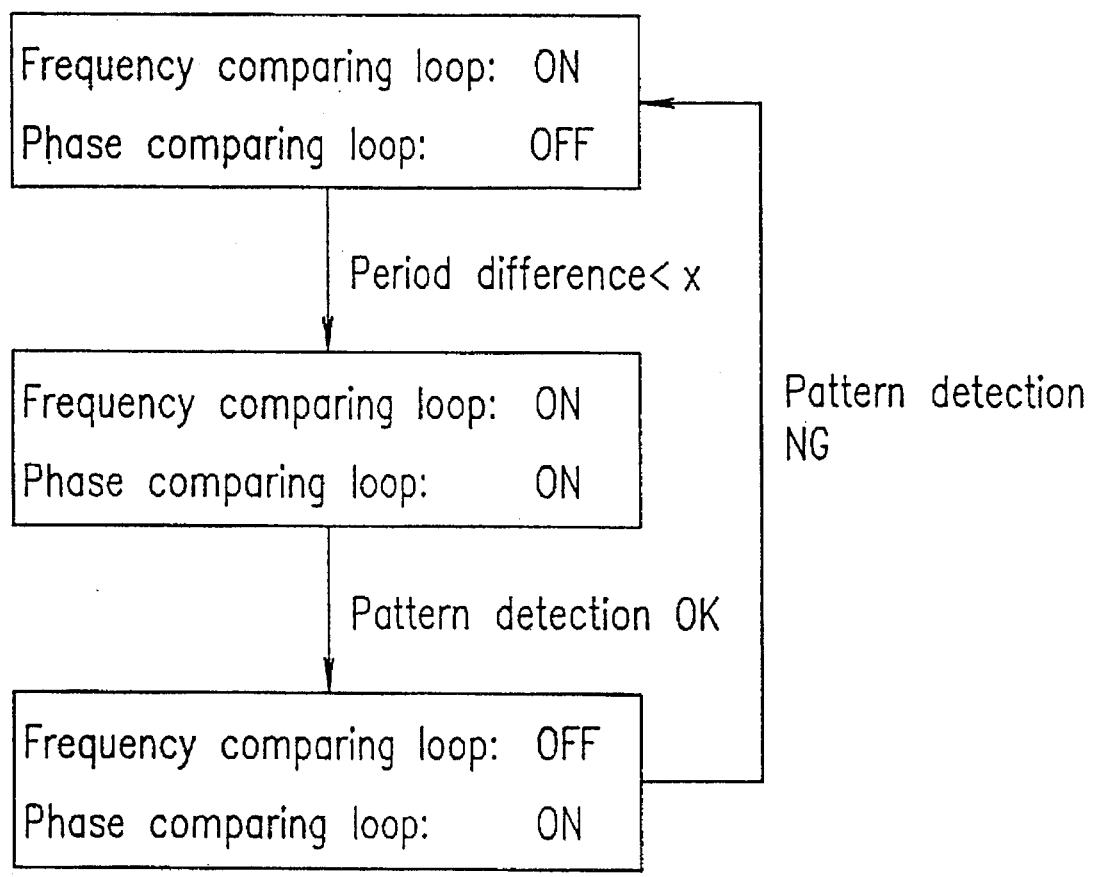
FIG. 11 is a diagram showing an example of an operation sequence when a disturbance occurs.

In FIG. 9, the operation sequence is terminated at the time when the switching is performed so as to allow only the phase locked loop to operate. However, there is a possibility that a large phase error signal is generated when a signal is lacked due to a defect on the disk or the like, thereby deviating the phase lock loop. In the case where the phase lock loop is significantly deviated in terms of frequency, the phase lock loop cannot return to its original state by itself. When the pattern detection cannot be performed, the frequency loop and the phase lock loop are temporarily allowed to operate simultaneously as shown in FIG. 10, Alternatively, the operation of the phase lock loop may be temporarily stopped to allow only the frequency loop to operate as shown in FIG. 11. As a result, the returnability against a disturbance can be enhanced.

Figure 12:
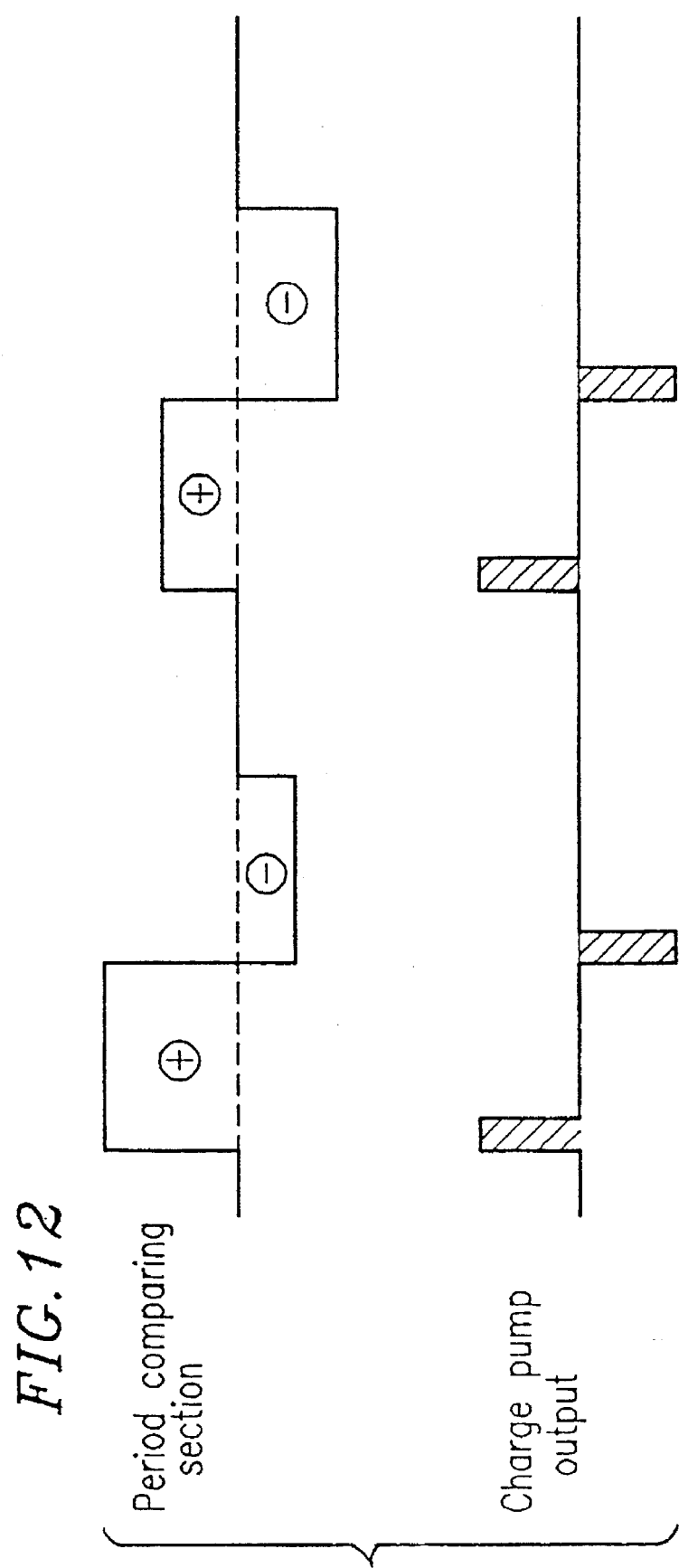
FIG. 12 is a timing chart showing an output signal when the charge pumps operate.

The charge pumps of Examples 1 and 2 may absorb or discharge a predetermined current in accordance with the polarity of a period difference signal output from the period comparing section for each predetermined period as shown in FIG. 12.

Figure 13:
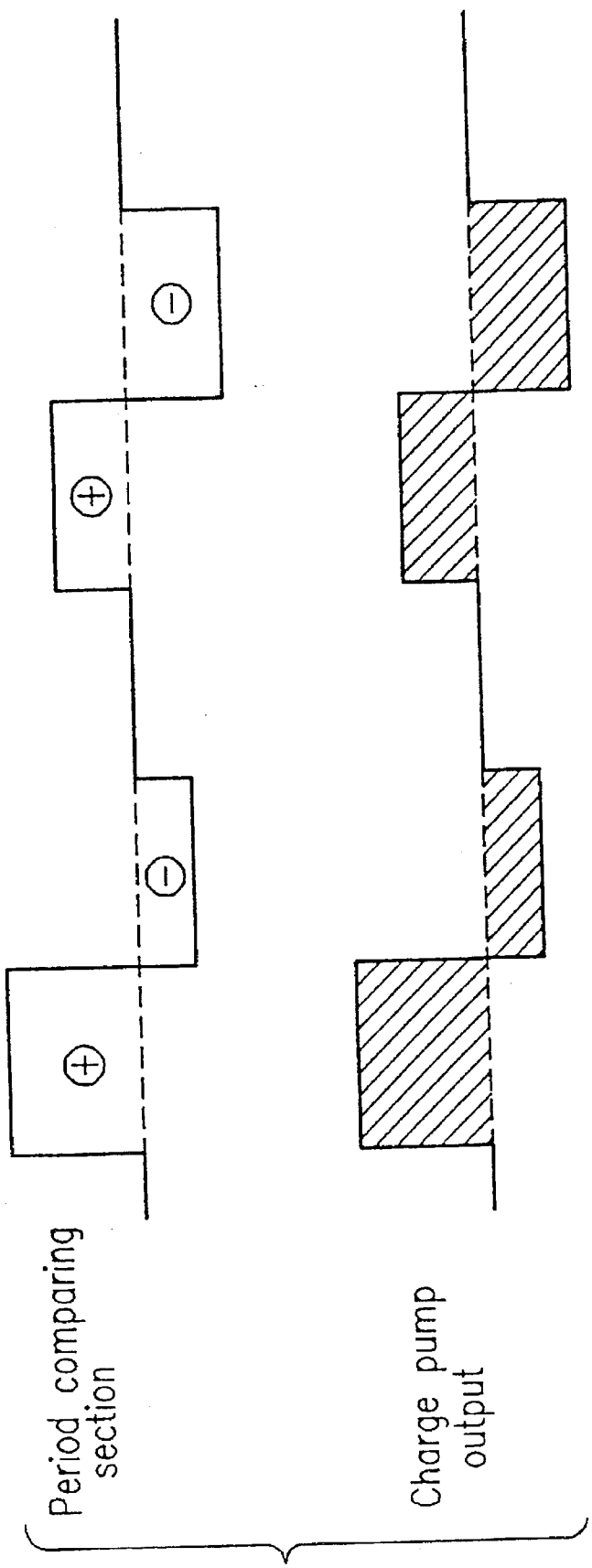
FIG. 13 is a timing chart showing an output signal when the charge pumps operate.

The charge pumps of Examples 1 and 2 may output a current for a predetermined time, which is proportional to a period difference signal output from the period comparing section for each predetermined period as shown in FIG. 13.

Figure 14:
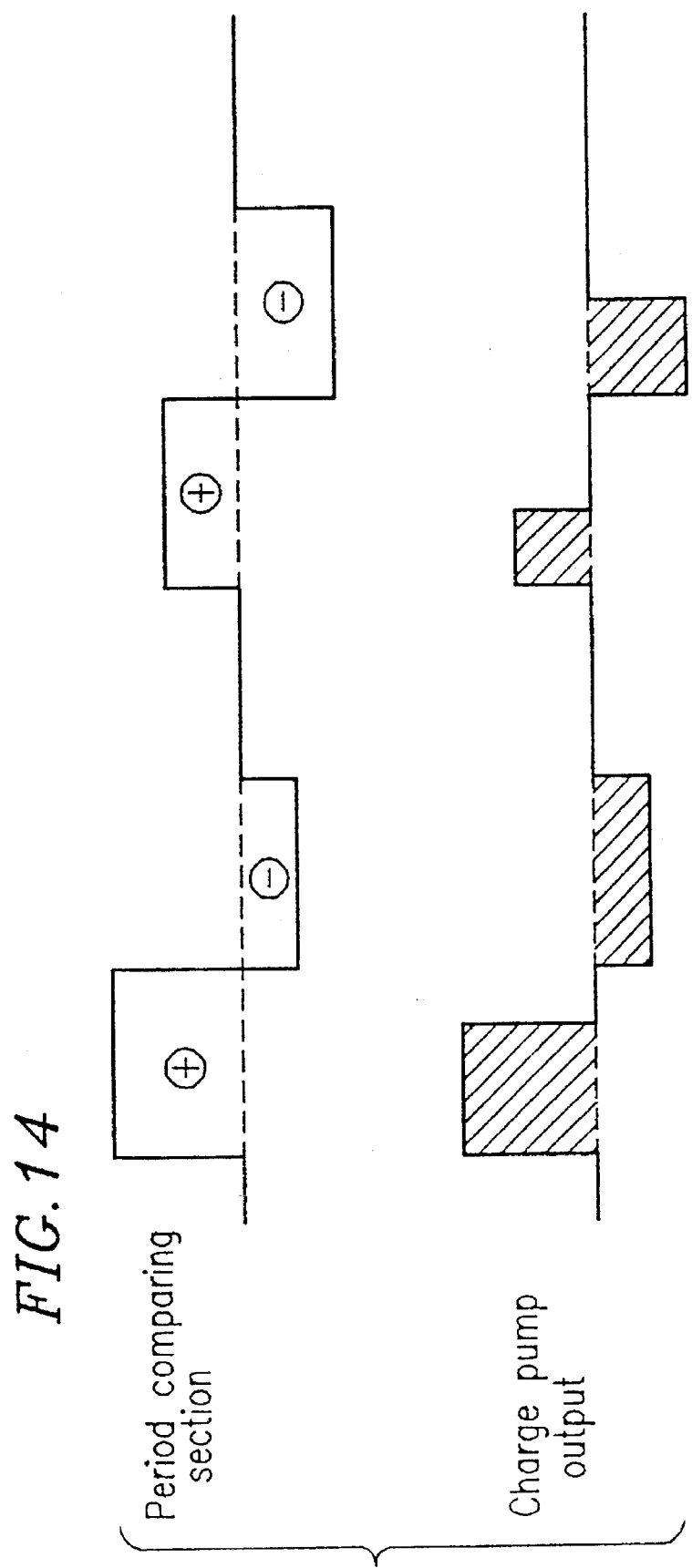
FIG. 14 is a timing chart showing an output signal when the charge pumps operate.

The charge pumps of Examples 1 and 2 may absorb or discharge a predetermined current in accordance with the polarity of a period difference signal output from the period comparing section for each predetermined period while being controlled at time intervals in accordance with an absolute value of a period difference signal as shown in FIG. 14.

Figure 15:
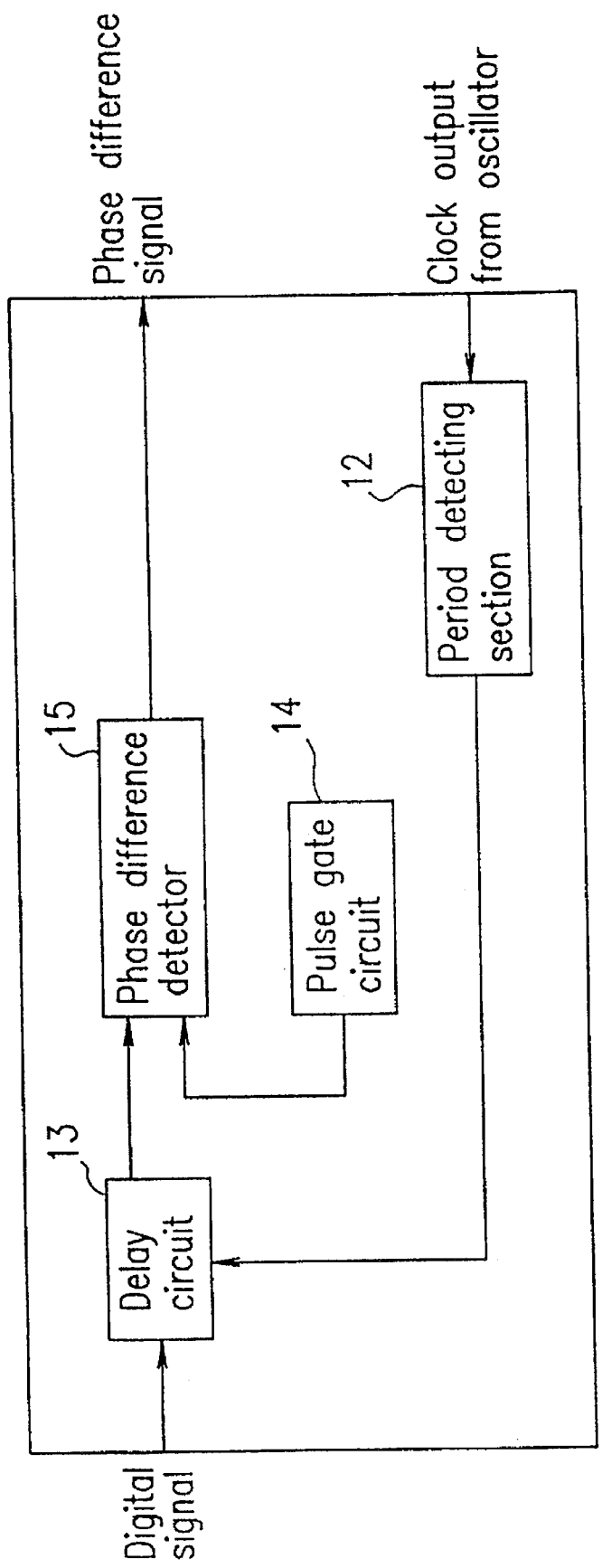
FIG. 15 is a block diagram showing a phase comparing section.

As shown in FIG. 15, the phase comparing section 2 includes: a period detecting section 12 for outputting a signal proportional to an oscillation period of the oscillator; a delay circuit 13 for delaying a digital signal proportional to an output from the oscillating period detecting section; a pulse gate circuit 14 for outputting clock edge information of the oscillating output only when the digital signal is input; and a phase difference detector 15 for comparing the phase of the output from the delay circuit 13 and the phase of the output from the pulse gate circuit so as to generate two pulses with a pulse width in accordance with the amount of a phase difference, which are representative of either positive or negative depending on whether the phase difference is plus or minus. Only when the edges of digital signal are input, the pulse gate circuit 14 allows the oscillator 5 to output a clock signal. Then, the phase difference detector 15 compares the phase of a signal obtained by delaying the digital signal by, for example, a half period of the oscillating clock signal in the delay circuit 13 with the phase of the oscillating clock signal. The amount of delay in the delay circuit 13 is controlled in proportion to the oscillating period of the oscillator so that a detection window of the phase difference detector 15 extends at the maximum. By this control, since a detection offset and a detection dead zone can be eliminated, it is possible to maximize the phase lock range.

Figure 16:
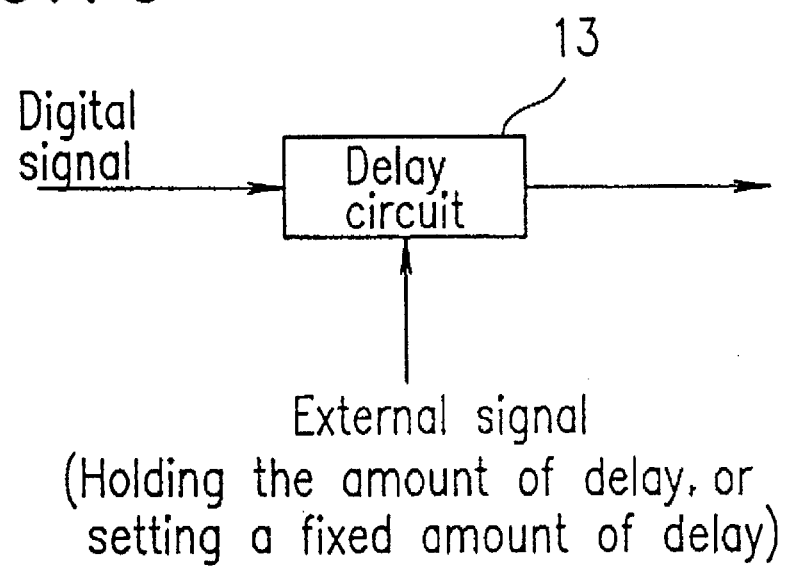
FIG. 16 is a diagram showing input and output signals of a delay circuit.

Alternatively, the amount of delay in the delay circuit 13 may be controlled in proportion to the oscillating period of the oscillator 5, and may be held by an external signal as shown in FIG. 16. By holding the amount of delay in the delay circuit 13 with a detection signal for a defect on a disk or the like, a phase difference signal is prevented from being disturbed.

Alternatively, the amount of delay in the delay circuit 13 may be controlled in proportion to the oscillating period of the oscillator 5 and may be switchable to a prescribed amount of delay by an external signal as shown in FIG. 16. By setting the amount of delay of the delay circuit 13 at a prescribed value by a detection signal for a defect on a disk or the like, a phase difference signal is prevented from being disturbed.

Figure 17:
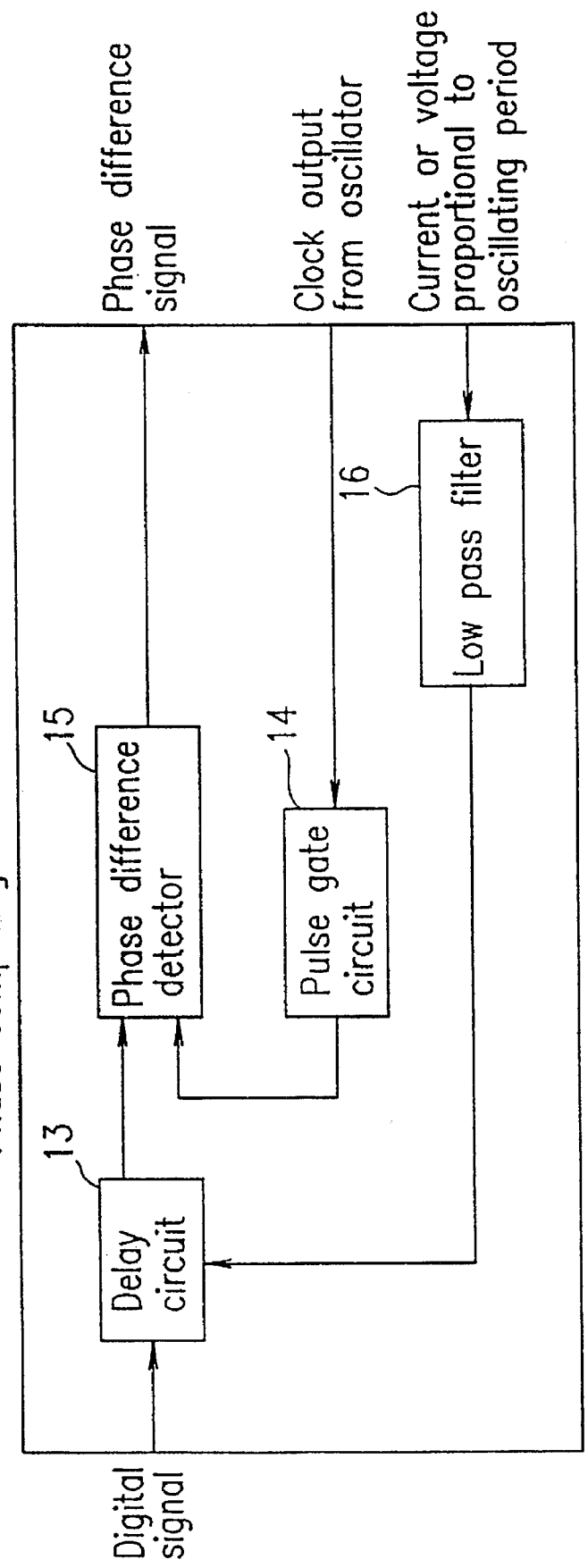
FIG. 17 is a block diagram connecting the delay circuit and an oscillator.

Alternatively, the amount of delay of the delay circuit 13 may be controlled in proportion to the current or the voltage which is low pass filtered through a filter 16 proportional to the oscillating period of the oscillator 5 as shown in FIG. 17. By performing low pass filtration, it is possible to prevent the amount of delay from unnecessarily changing with respect to the disturbance.

Figure 18:
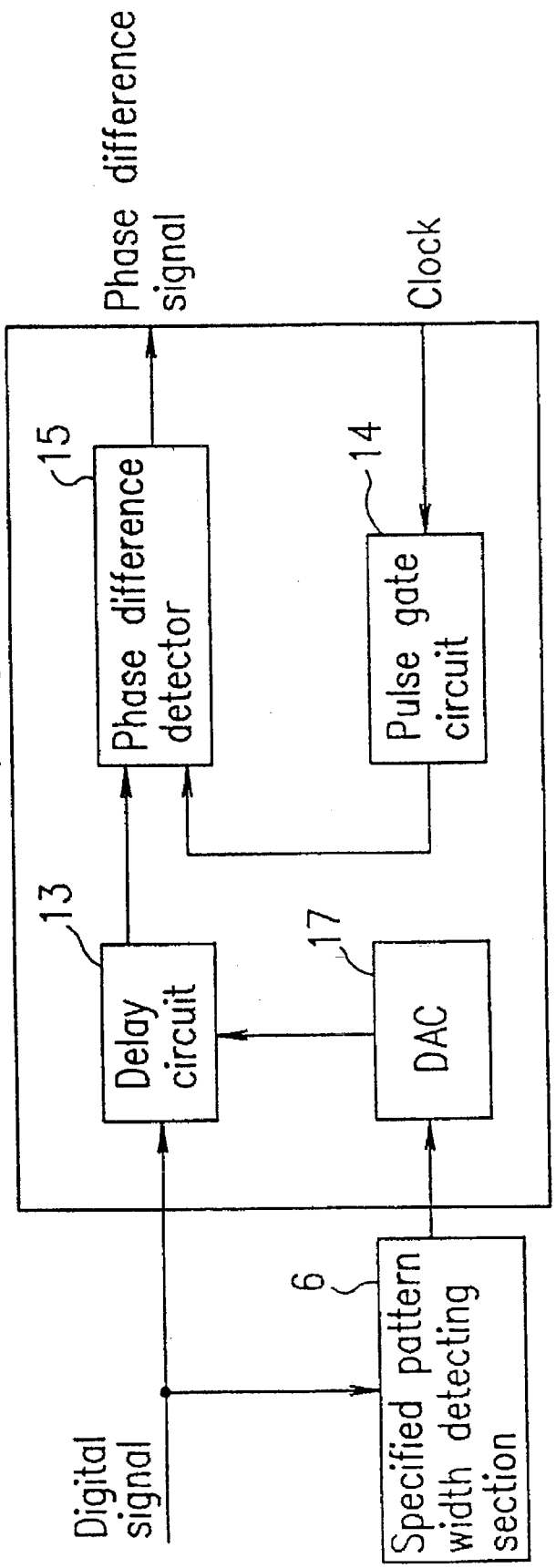
FIG. 18 is a block diagram showing a phase comparing section.
Figure 19:
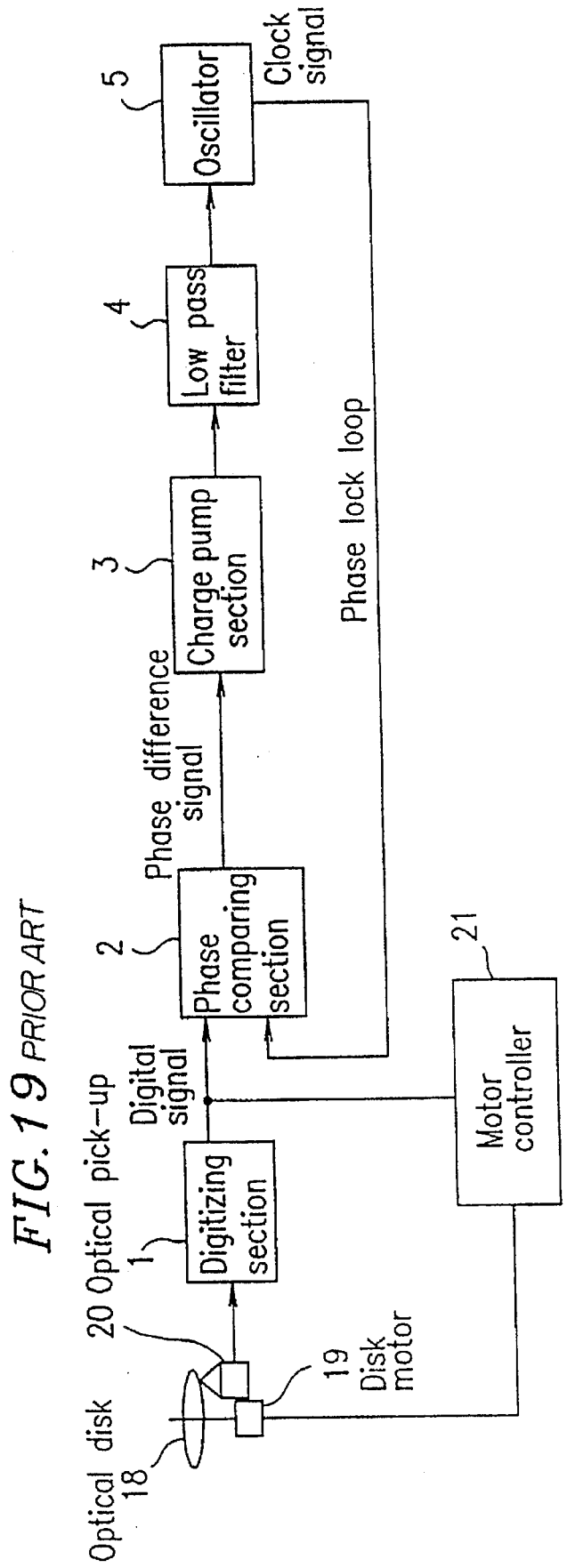
FIG. 19 is a block diagram showing a conventional data detection apparatus.
Figure 20:
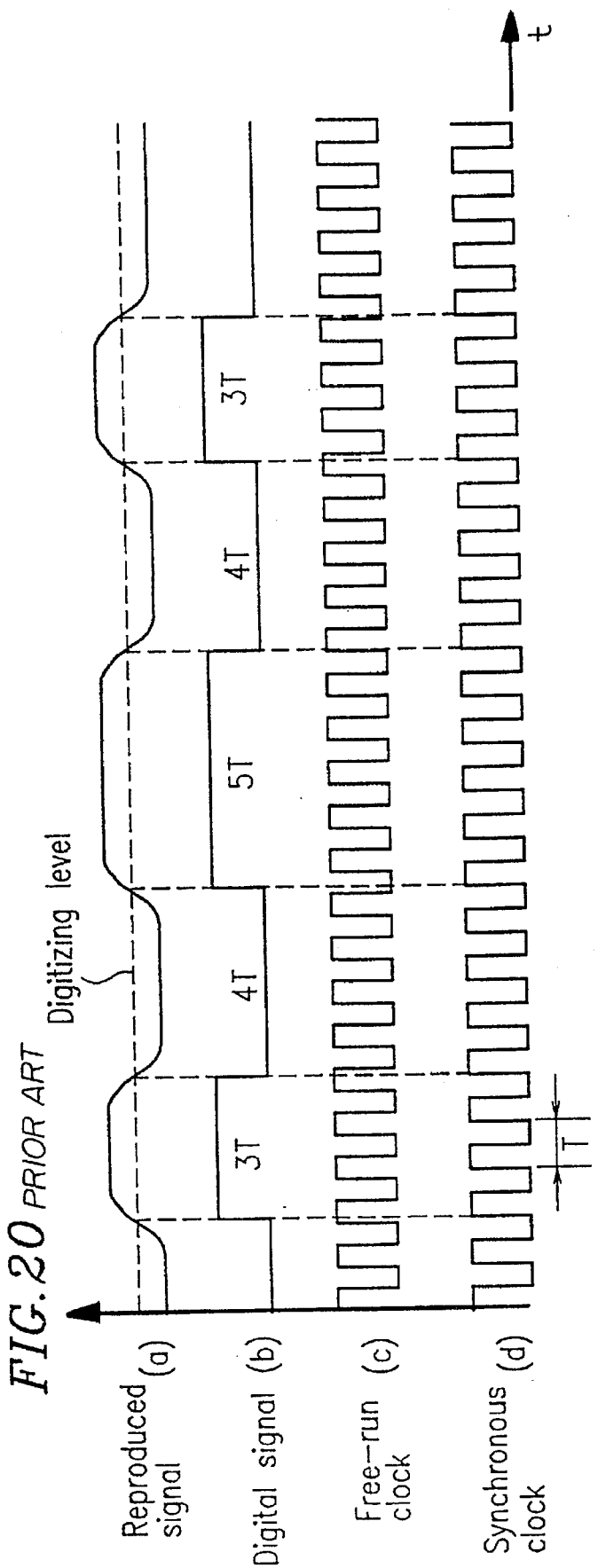
FIG. 20 is a timing chart showing the operation of a conventional data detection apparatus.
Figure 21:
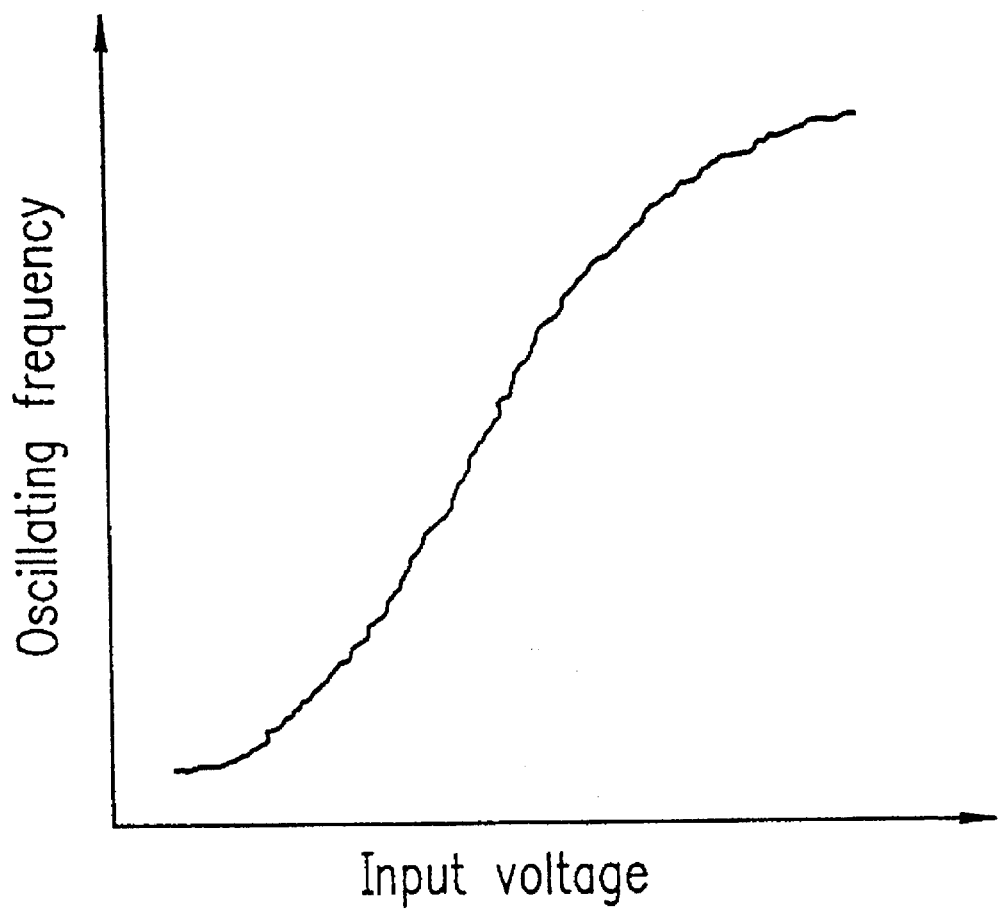
FIG. 21 is a graph showing an example of an input voltage versus output frequency characteristic of the oscillator.
Figure 22:
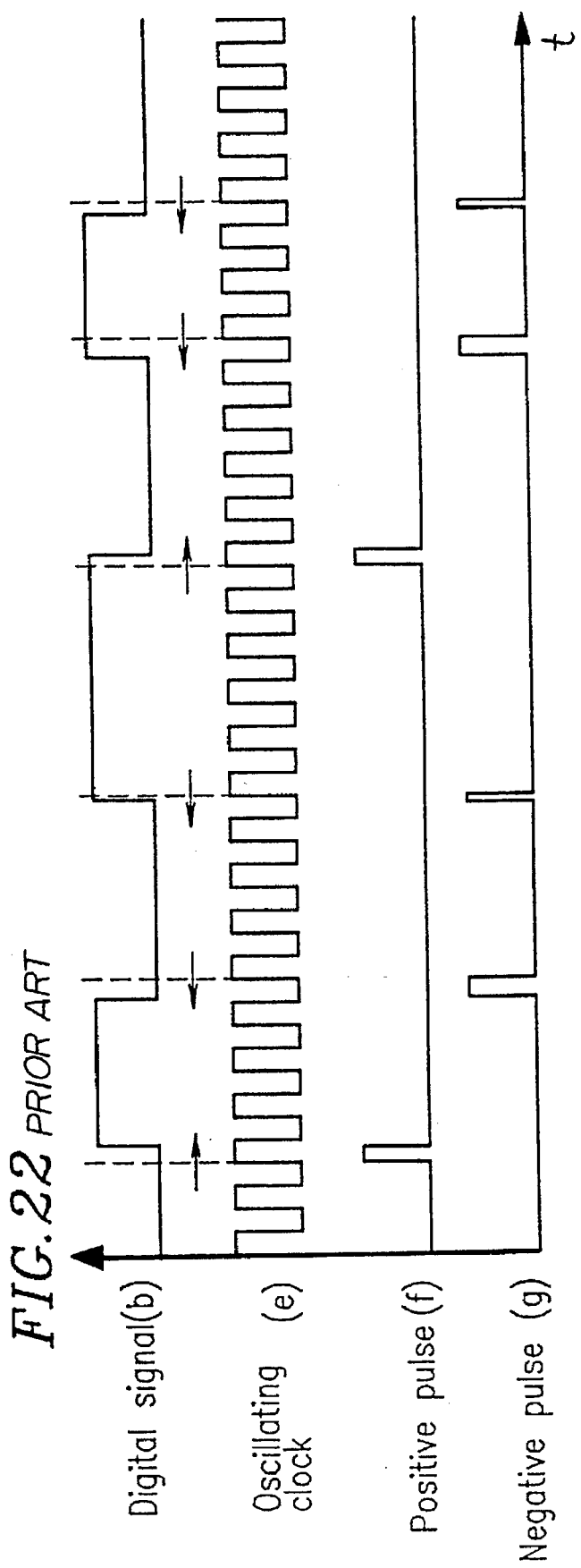
FIG. 22 is a timing chart showing the operation of a phase comparing section.
Figure 23:
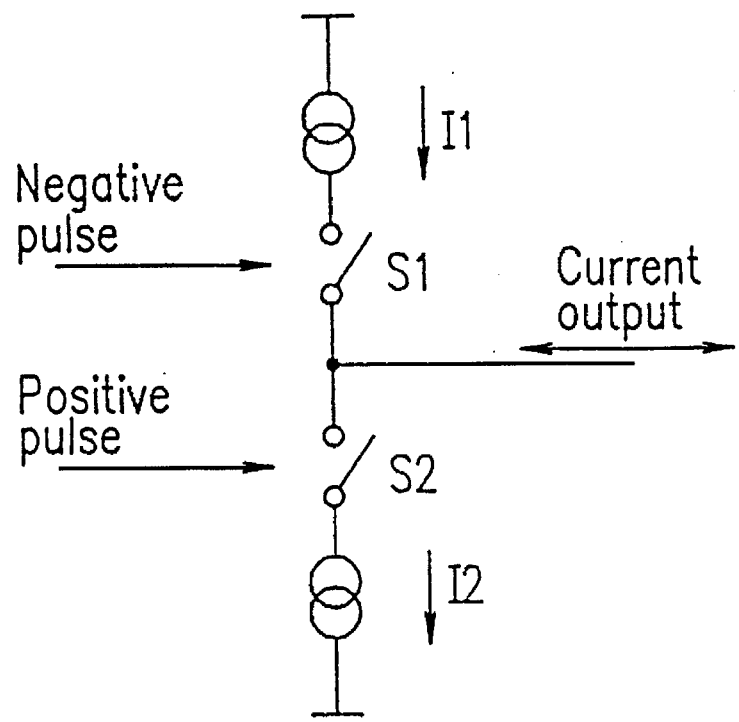
FIG. 23 is a circuit diagram showing a charge pump section.
Figure 24:
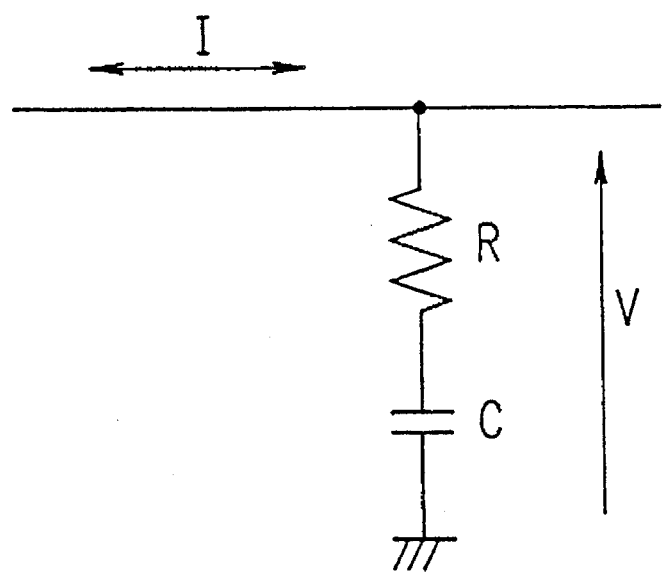
FIG. 24 is a circuit diagram showing a low pass filter.
Figure 25:
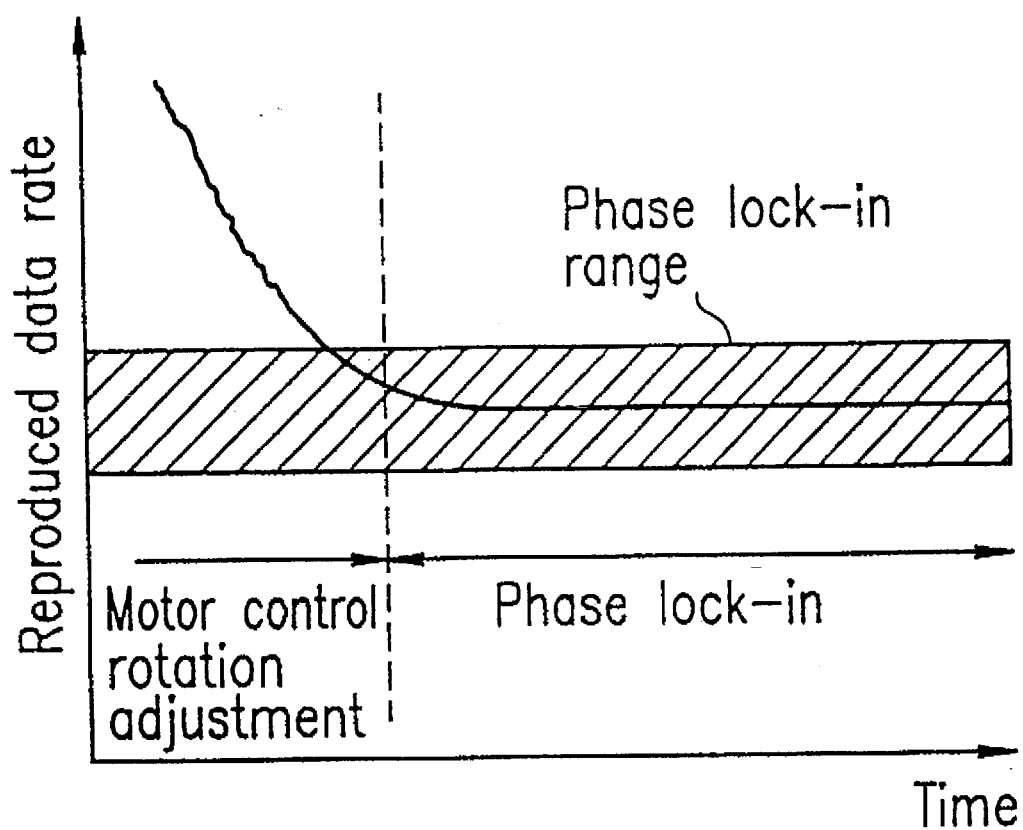
FIG. 25 is a graph showing the motor control until a phase lock is performed.
Figure 26:
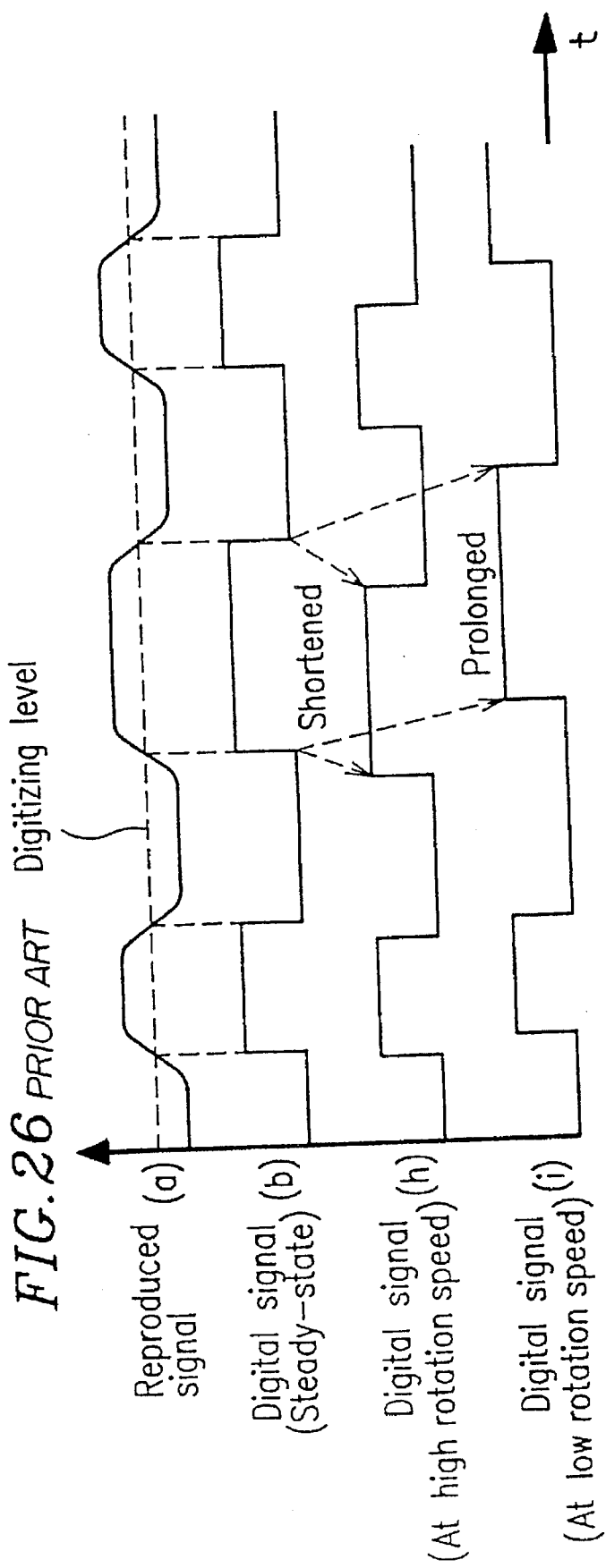
FIG. 26 is a timing chart showing the operation of the motor control.

As shown in FIG. 18, the phase comparing section 2 includes: a digital-analog convertor 17 for outputting a current or a voltage proportional to a count value of the specified pattern width detecting section; the delay circuit 13 for providing a delay proportional to an output from the digital-analog convertor 17; the pulse gate circuit 14 for allowing the oscillator 5 to output a clock signal only when the edges of the digital signal are input; and a phase difference detector 15 for comparing the phase of the output from the delay circuit 13 and the phase of the output from the pulse gate circuit so as to generate two pulses with a pulse width in accordance with the amount of phase difference, which are representative of either positive or negative depending on whether the phase difference is plus or minus. The amount of delay in the delay circuit 13 is controlled in proportion to the oscillating period of the oscillator so that a detection window of the phase difference detector 15 extends to the maximum. By this control, since a detection offset and a detection dead zone can be eliminated, it is possible to maximize the phase lock range.

The phase comparing section 2 may have other configurations as long as the phase comparing operation can be realized.

Although the present invention is described regarding a disk on which the data is recorded by a CLV method in Examples 1 and 2, other recording methods, for example a CAV recording method, may be used as long as reproduction linear velocity information of the disk is obtained from the recorded data.

The charge pumps of the charge pump section described in Examples 1 and 2 are current-drive type charge pumps which output a current in accordance with a phase difference signal. However, the charge pumps may be voltage-drive type charge pumps which output a voltage in accordance with a phase difference signal.

Although the digitizing section for digitizing a reproduced signal from an optical disk is provided in Example 1, it is apparent from the digitalization may be performed after waveform equalization for reducing the interference between codes of a reproduced signal or for improving a signal to noise ratio is performed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An apparatus for reproducing digital information which is subjected to modulation recording with a discrete record length, comprising:

a digitizing section for digitizing a reproduced signal at a predetermined level so as to output a digital signal;

an oscillator for outputting a clock signal having a frequency proportional to an input signal;

a phase comparing section for comparing the digital signal with the clock signal so as to output a first difference signal indicating a difference in phase between the digital signal and the clock signal;

a specified pattern width detecting section for detecting a time interval of a specified pattern included in the digital signal so as to output first information indicating either a reproduced period or a reproduced frequency;

an oscillating period detecting section for detecting a period of the clock signal so as to output second information indicating either an oscillating period or an oscillating frequency of the oscillator;

a period comparing section for comparing the first information with the second information so as to output a second difference signal indicating a difference between the first information and the second information;

an operating section for performing an operation in accordance with the first difference signal and the second difference signal; and a filter for limiting a frequency band of the output from the operating section so as to output a resultant signal as an input signal for oscillator;

wherein the apparatus has: a phase lock loop operating so that the clock signal is phase-locked with an edge of the digital signal by the oscillator, the phase comparing section, the operating section and the filter; and a frequency loop operating so that a clock period and reproducing period become almost identical to each other by the oscillator, the specified pattern width detecting section, the oscillating period detecting section, the period comparing section, the operating section and the filter.

2. An apparatus according to claim 1, wherein the specified pattern width detecting section counts the time interval of the specified pattern included in the digital signal with a fixed clock.

3. An apparatus according to claim 1, wherein the oscillating period detecting section counts a period of n cycles of the clock signal with a fixed clock, where n is a natural number.

4. An apparatus according to claim 1, wherein the operating section is a voltage generator for receiving the first difference signal and the second difference signal so as to output a voltage in accordance therewith.

5. An apparatus according to claim 1, wherein the operating section is a charge pump section for receiving the first difference signal and the second difference signal so as to discharge or absorb a current in accordance therewith.

6. An apparatus according to claim 5, wherein the charge pump section includes an adder for receiving the first difference signal and the second difference signal so as to output a logical OR signal of the first and second difference signals, and a charge pump for discharging or absorbing a current in accordance with the logical OR signal.

7. An apparatus according to claim 5, wherein the charge pump section includes a first charge pump for discharging or absorbing a current having a first value in accordance with the first difference signal and a second charge pump for discharging or absorbing a current having a second value in accordance with the second difference signal.

8. An apparatus according to claim 5, wherein the charge pump section includes a first hold control input for inhibiting a discharging and absorbing operation of a current in accordance with the first difference signal so as to stop a phase lock loop, a second hold control input for inhibiting a discharging and absorbing operation of a current in accordance with the second difference signal so as to stop a frequency loop, and a loop controller for outputting a control signal to the fist hold control input and the second hold control input.

9. An apparatus according to claim 3, wherein the oscillating period detecting section counts a period of n cycles of the clock signal with a clock having a 1k frequency of the fixed clock, where n and k each is a natural number.

10. An apparatus according to claim 8, further comprising a synchronization detecting for detecting a phase locked state between the clock signal and the digital signal so as to output a synchronization detection signal, wherein the loop controller operates the phase lock loop and the frequency loop in accordance with the synchronization detection signal.

11. An apparatus according to claim 10, wherein the synchronization detecting section detects that a value obtained by integrating an absolute value of the first difference signal is at a level equal to or lower than a prescribed level.

12. An apparatus according to claim 8, wherein the loop controller receives the second difference signal so as to control the phase lock loop and the frequency loop in accordance with the second difference signal.

13. An apparatus according to claim 8, further comprising a synchronization section for receiving the digital signal and the clock signal so as to output reproduced data in which the digital signal is synchronized with the clock signal and a pattern detecting section for receiving the clock signal and the reproduced signal so as to detect the presence of a periodic pattern periodically included in the reproduced data and whether the pattern has a periodicity, wherein the loop controller receives a signal output from the pattern detecting section so as to operate the phase lock loop and the frequency loop in accordance with the signal.

14. An apparatus according to claim 8, further comprising a synchronization detecting section for detecting a phase locked state between the clock signal and the digital signal so as to output a synchronization detection signal, a synchronizing section for receiving the digital signal and the clock signal so as to output reproduced data in which the digital signal is synchronized with the clock signal, and a pattern detecting section for receiving the clock signal and the reproduced signal so as to detect the presence of a periodic pattern periodically included in the reproduced data and whether the pattern has a periodicity, wherein the loop controller receives a signal output from the pattern detecting section so as to operate the phase lock loop and the frequency loop in accordance with the signal.

15. An apparatus according to claim 8, further comprising:

a synchronization section for receiving the digital signal and the clock signal so as to output reproduced data synchronized with the clock signal; and a pattern detecting section for receiving the clock signal and the reproduced data so as to detect the presence of a periodic pattern periodically included in the reproduced data, wherein the loop controller receives the second difference signal and a signal output from the pattern detecting section so as to operate the phase lock loop and the frequency loop in accordance therewith.

16. An apparatus according to claim 8, further comprising a synchronization detecting section for detecting a phase locked state between the clock signal and the digital signal so as to output a synchronization detecting signal, wherein the loop controller receives the second difference signal and the synchronization detecting signal so as to operate the phase lock loop and the frequency loop in accordance therewith.

17. An apparatus according to claim 8, further comprising:

a synchronization detecting section for detecting a phase locked state between the clock signal and the digital signal so as to output a synchronization detecting signal;

a synchronization section for receiving the digital signal and the clock signal so as to output reproduced data in which the digital signal is synchronized with the clock signal; and a pattern detecting section for receiving the clock signal and the reproduced data so as to detect the presence of a periodic pattern periodically included in the reproduced data and whether the pattern has a periodicity, wherein the loop controller receives the second difference signal, the synchronization detecting signal and an output from the pattern detecting section so as to operate the phase lock loop and the frequency loop in accordance therewith.

18. An apparatus according to claim 17, wherein the loop controller receives the synchronization detecting signal or a signal output from the pattern detecting section as a second hold control input for the charge pump section and receives the second difference signal as a first hold control input for the charge pump section, wherein, upon a phase lock-in, the phase lock loop is inhibited from operating while still allowing the frequency loop to operate until the second difference signal falls within a prescribed range, both the phase lock loop and the frequency loop are operated when the second difference signal falls within the prescribed range, and the frequency loop is inhibited from operating while allowing the phase lock loop to operate when a periodic pattern is detected by the synchronization detecting signal or the pattern detecting section.

19. An apparatus according to claim 17, wherein the loop controller receives the synchronization detecting signal or a signal output from the pattern detecting section as a second hold control input for the charge pump section and receives the second difference signal as a first hold control input for the charge pump section, wherein, upon a phase lock-in, the phase lock loop is inhibited from operating while still allowing the frequency loop to operate until the second difference signal falls within a prescribed range, both the phase lock loop and the frequency loop are operated when the second difference signal falls within the prescribed range, and the frequency loop is inhibited from operating while allowing the phase lock loop to operate when a phase locked state is detected by the synchronization detecting signal or a periodic pattern is detected by the pattern detecting section, and both the phase lock loop and the frequency loop are operated when the phase locked state or the periodic pattern is not detected by the synchronization detecting signal any more.

20. An apparatus according to claim 17, wherein the loop controller receives the synchronization detecting signal or the output from the pattern detection section as a second hold control input for the charge pump section and receives the second difference signal as a first hold control input for the charge pump section, wherein, upon a phase lock-in, the phase lock loop is inhibited from operating while still allowing the frequency loop to operate until the second difference signal falls within a prescribed range, both the phase lock loop and the frequency loop are operated when the first difference signal falls within the prescribed range, and the frequency loop is inhibited from operating while allowing the phase lock loop to operate when a periodic pattern is detected by the synchronization detecting signal or the pattern detecting section, and both the phase lock loop and the frequency loop are operated when the phase locked state is not detected by the synchronization detecting signal or the periodic pattern is not detected by the pattern detecting section.

21. An apparatus according to claim 14, wherein the loop controller receives the synchronization detecting signal or a signal output from the pattern detection section as a second hold control input for the charge pump section and receives a tracking on signal of a disk drive as a first hold control input for the charge pump section, wherein, upon a phase lock-in, the phase lock loop is inhibited from operating while still allowing the frequency loop to operate in a tracking off state, both the phase lock loop and the frequency loop are operated in a tracking on state, and the frequency loop is inhibited from operating while allowing the phase lock loop to operate when the phase locked state is detected by the synchronization detecting signal or a periodic pattern is detected by the pattern detecting section.

22. An apparatus according to claim 14, wherein the loop controller receives the synchronization detecting signal or the signal output from the pattern detection section as a second hold control input for the charge pump section and receives a tracking on signal of a disk drive as a first hold control input for the charge pump section, wherein, upon a phase lock-in, the phase lock loop is inhibited from operating while still allowing the frequency loop to operate in a tracking off state, both the phase lock loop and the frequency loop are operated in a tracking on state, and the frequency loop is inhibited from operating while allowing the phase lock loop to operate when the phase locked state is detected by the lock detecting signal or a periodic patter is detected by the pattern detecting section, and the phase lock loop and the frequency loop are operated when the periodic pattern is not detected.

23. An apparatus according to claim 14, wherein the loop controller receives the synchronization detecting signal or the signal output from the pattern detection section as a second hold control input for the charge pump section and receives a tracking on signal of a disk drive as a first hold control input for the charge pump section, wherein, upon a phase lock-in, the phase lock loop is inhibited from operating while still allowing the frequency loop to operate in a tracking off state, both the phase lock loop and the frequency loop are operated in a tracking on state, and the frequency loop is inhibited from operating while allowing the phase lock loop to operate when a phase locked state is detected by the synchronization detecting signal or a periodic pattern is detected by the pattern detecting section, and the phase lock loop is inhibited from operating while allowing the frequency loop to operate when the periodic pattern is not detected by the pattern detecting section any more.

24. An apparatus according to claim 5, wherein the charge pump section discharges or absorbs a predetermined current for a predetermined time in accordance with a polarity of the second difference signal output from the period comparing section for each predetermined period.

25. An apparatus according to claim 5, wherein the charge pump section outputs a current for a predetermined time proportional to the second difference signal output from the period comparing section for each predetermined period.

26. An apparatus according to claim 5, wherein the charge pump section discharges or absorbs a predetermined current for a predetermined time in accordance with a polarity of the second difference signal output from the period comparing section for each predetermined period under control at a time interval proportional to an absolute value of the second difference signal.

27. An apparatus according to claim 1, wherein the phase comparing section includes: a period detector for outputting a signal proportional to an oscillating period of the oscillator; a delay circuit for delaying the digital signal proportional to an output from the period detecting section; a pulse gate circuit for outputting clock edge information of an oscillating output from the oscillator only hen the digital signal is input; an phase difference detector for comparing a phase of an output from the delay circuit and a phase of the output from the pulse gate circuit so as to generate two pulse representative of positive or negative in accordance with whether a phase difference is plus or minus with a pulse width in accordance with the amount of the phase difference, and wherein the amount of delay of the delay circuit is controlled so as to be proportional to an oscillating period of the oscillator.

28. An apparatus according to claim 27, wherein the amount of delay of the delay circuit is controlled so as to be proportional to the oscillating period of the oscillator and is capable of being held by an external signal.

29. An apparatus according to claim 27, wherein the amount of delay of the delay circuit is controlled so as to be proportional to the oscillating period of the oscillator and is switchable to a prescribed amount of delay by an external signal.

30. An apparatus according to claim 27, wherein the amount of delay of the delay circuit is controlled so as to be proportional to a current or a voltage proportional to the oscillating period of the oscillator which is subjected to low pass filtration.

31. An apparatus according to claim 1, wherein the phase comparing section includes: a digital-analog convertor for outputting a current or a voltage proportional to a count value of the specified pattern width detecting section; a delay circuit for providing the amount of delay proportional to an output from the digital to analog convertor; a pulse gate circuit for outputting clock edge information serving as an output of the oscillator only when the digital signal is input; and a phase difference detector for comparing a phase of an output from the delay circuit and a phase of the output from the pulse gate circuit so as to generate two pulses, which are representative of positive or negative in accordance with whether a phase difference is plus or minus, with a pulse width in accordance with the amount of the phase difference, and wherein the amount of delay of the delay circuit is controlled proportional to a count value of the specified pattern width detecting section.

* * * * *

UNITED STATES PATENT AND TRADEMARK OFFICE
CERTIFICATE OF CORRECTION

PATENT NO. : 5,666,341
DATED : September 9, 1997
INVENTOR(S) : Ryusuke Horibe et al.

It is certified that error appears in the above-identified patent and that said Letters Patent is hereby corrected as shown below:

In the Claims:

Claim 9, line 3, change "1k" to --1/k--.

Claim 27, line 7, change "hen" to --when--.

Signed and Sealed this

Twentieth Day of January, 1998

Attest:

BRUCE LEHMAN

Attesting Officer

Commissioner of Patents and Trademarks